(12) United States Patent
Okayama et al.

(10) Patent No.: US 9,466,468 B2
(45) Date of Patent: Oct. 11, 2016

(54) SHOWER HEAD, PLASMA PROCESSING APPARATUS AND PLASMA PROCESSING METHOD

(71) Applicant: Tokyo Electron Limited, Tokyo (JP)

(72) Inventors: Nobuyuki Okayama, Miyagi (JP); Koichi Kazama, Miyagi (JP); Shuichiro Uda, Miyagi (JP); Satoshi Yamada, Miyagi (JP); Shinji Fuchigami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 35 days.

(21) Appl. No.: 14/224,109

(22) Filed: Mar. 25, 2014

(65) Prior Publication Data

US 2014/0291286 A1   Oct. 2, 2014

(30) Foreign Application Priority Data

Mar. 26, 2013  (JP) .................. 2013-064289

(51) Int. Cl.
*H01J 37/22* (2006.01)
*C23C 16/455* (2006.01)
*H01J 37/32* (2006.01)

(52) U.S. Cl.
CPC ..... *H01J 37/3244* (2013.01); *C23C 16/45519* (2013.01); *C23C 16/45561* (2013.01); *C23C 16/45574* (2013.01); *C23C 16/45514* (2013.01)

(58) Field of Classification Search
CPC ............ H01J 37/3244; C23C 16/45561; C23C 16/45519; C23C 16/45514; C23C 16/45574

See application file for complete search history.

(56) References Cited

U.S. PATENT DOCUMENTS

| | | | | |
|---|---|---|---|---|
| 5,000,113 A | * | 3/1991 | Wang | C23C 16/402 118/715 |
| 5,516,366 A | * | 5/1996 | Kanno | C23C 16/52 118/715 |
| 5,616,208 A | * | 4/1997 | Lee | B08B 7/00 118/715 |
| 5,653,807 A | * | 8/1997 | Crumbaker | C23C 16/44 118/715 |
| 6,059,885 A | * | 5/2000 | Ohashi | C23C 16/4401 118/715 |
| 6,502,530 B1 | * | 1/2003 | Turlot | C23C 16/455 118/723 E |
| 6,579,372 B2 | * | 6/2003 | Park | C23C 16/45544 118/715 |

(Continued)

FOREIGN PATENT DOCUMENTS

JP   2009-117477 A   5/2009

*Primary Examiner* — Jeffrie R Lund
(74) *Attorney, Agent, or Firm* — Rothwell, Figg, Ernst & Manbeck, P.C.

(57) ABSTRACT

A shower head includes a gas injection plate and a gas supply unit. The gas supply unit has a first gas supply path provided in a region along the axis and a second gas supply path provided in a region surrounding the region where the first gas supply path is provided. The first gas supply path has a first gas diffusion space connected to a first gas line of the gas supply unit, second gas lines, a second gas diffusion space, third gas lines and a third gas diffusion space which are connected in that order. The second gas supply path has a fourth gas diffusion space connected to a fourth gas line of the gas supply unit, fifth gas lines, a fifth gas diffusion space, sixth gas lines, and a sixth gas diffusion space which are connected in that order.

7 Claims, 21 Drawing Sheets

(56) References Cited

U.S. PATENT DOCUMENTS

| | | | | |
|---|---|---|---|---|
| 6,800,139 | B1* | 10/2004 | Shinriki | C23C 16/409 118/715 |
| 8,882,913 | B2* | 11/2014 | Byun | C23C 16/40 118/715 |
| 2001/0002582 | A1* | 6/2001 | Dunham | C23C 16/45565 118/715 |
| 2004/0127067 | A1* | 7/2004 | Dunham | C23C 16/455 438/778 |
| 2004/0134611 | A1* | 7/2004 | Kato | C23C 16/455 156/345.33 |
| 2005/0001556 | A1* | 1/2005 | Hoffman | H01J 37/32091 315/111.91 |
| 2006/0288934 | A1* | 12/2006 | Takahashi | C23F 4/00 118/715 |
| 2007/0181181 | A1* | 8/2007 | Mizusawa | C23C 16/45565 137/1 |
| 2008/0141941 | A1* | 6/2008 | Augustino | C23C 16/45565 118/723 R |
| 2009/0117746 | A1 | 5/2009 | Masuda | |
| 2012/0247678 | A1* | 10/2012 | Takahashi | H01J 37/32009 156/345.44 |
| 2014/0130743 | A1* | 5/2014 | Toriya | C23C 16/45544 118/725 |
| 2014/0291286 | A1* | 10/2014 | Okayama | H01J 37/3244 216/37 |
| 2015/0107772 | A1* | 4/2015 | Uchida | H01J 37/32091 156/345.33 |
| 2016/0111256 | A1* | 4/2016 | Stowell | H01J 37/32119 156/345.33 |
| 2016/0111257 | A1* | 4/2016 | Kellogg | H01J 37/3244 438/710 |

\* cited by examiner

SHOWER HEAD, PLASMA PROCESSING APPARATUS AND PLASMA PROCESSING METHOD

CROSS-REFERENCE TO RELATED APPLICATION

This application claims priority to Japanese Patent Application No. 2013-064289 filed on Mar. 26, 2013, the entire contents of which are incorporated herein by reference.

FIELD OF THE INVENTION

The present invention relates to a shower head, a plasma processing apparatus and a plasma processing method.

BACKGROUND OF THE INVENTION

In a process of manufacturing electronic devices such as semiconductor devices or liquid display devices, treatment such as film formation on an object or etching for the object is carried out. A plasma processing apparatus has been widely used for such treatment for the object. For example, a parallel plate type plasma processing apparatus has been used.

The parallel plate type plasma processing apparatus includes a processing chamber, a mounting table and a shower head. The mounting table includes a lower electrode and is provided in the processing chamber. The shower head is provided above the mounting table and supplies a processing gas toward the object mounted on the mounting table. Further, the shower head serves as an upper electrode. In the parallel plate type plasma processing apparatus, the processing gas is supplied from the shower head into the processing chamber, and a high frequency electric field is generated between the upper electrode and the lower electrode. Accordingly, a plasma of the processing gas is generated and the object is processed by active species of atoms and/or molecules in the processing gas.

In this plasma processing apparatus, it is required to reduce non-uniformity of the treatment for the object in the surface of the object (hereinafter, referred to as "in-plane non-uniformity"). The following Patent Document 1 discloses a plasma processing apparatus capable of controlling a flow rate and/or a type of the processing gas supplied toward a plurality of regions in the surface of the object in order to reduce the in-plane non-uniformity.

Specifically, in the plasma processing apparatus disclosed in Japanese Patent Application Publication No. 2009-117477, the shower head has a facing plate. The facing plate has a plurality of coaxial regions, and a plurality of gas injection holes is formed in each of the regions. Further, a plurality of gas diffusion spaces is coaxially formed immediately above the facing plate. In other words, a first gas diffusion space is formed immediately above a first region at the center of the facing plate. A second gas diffusion space is formed immediately above a second region of the facing plate extending in an annular shape at the outer side of the first region. A third gas diffusion space is formed immediately above a third region of the facing plate which extends in an annular shape at the outer side of the second region. The first gas diffusion space is connected to a plurality of gas injection holes formed in the first region. The second gas diffusion space is connected to a plurality of gas injection holes formed in the second region. The third gas diffusion space is connected to a plurality of gas injection holes formed in the third region.

Further, the plasma processing apparatus of Japanese Patent Application Publication No. 2009-117477 has a plurality of gas branch lines, i.e., a plurality of gas inlet lines, and a gas from a source gas is supplied into a plurality of gas diffusion spaces through the gas inlet lines. Specifically, a first gas inlet line connected to a first gas diffusion space extends along the central axes of the first to the third gas diffusion spaces. Meanwhile, a second and a third gas inlet line respectively connected to the second and the third gas diffusion space extend while being spaced apart from the central axes. Accordingly, the second and the third gas inlet line are connected to the second and the third gas diffusion space while being spaced apart from the central axes of the second and the third gas diffusion space, respectively.

In the plasma processing apparatus of Japanese Patent Application Publication No. 2009-117477, flow rates of gases injected from the gas injection holes formed in the second region may be not uniform. Further, flow rates of gases injected from the gas injection holes formed in the third region may be not uniform. In other words, the gas injection holes directly connected to the same gas diffusion space have different injection amounts depending on whether or not they are formed near the connection position of the gas inlet line. As a result, in-plane non-uniformity may occur in the processing of the object.

SUMMARY OF THE INVENTION

Therefore, the gas supply path needs to be configured such that the difference in the flow rates of the gases injected from the gas injection holes connected to the same gas diffusion space is reduced. Further, the difference in time from the input of the gas to the shower head to the injection of the gas from the gas injection holes needs to be reduced.

In accordance with an aspect of the present invention, there is provided a shower head for a plasma processing apparatus, including: a gas injection plate including a first region and a second region extending to coaxially surround the first region; and a gas supply unit provided on the gas injection plate, the gas supply unit including a first gas supply path and a second gas supply path arranged coaxially about the axis, wherein the first gas supply path is provided in a region along the axis to supply a processing gas to a plurality of gas injection holes formed in the first region of the gas injection plate; the second gas supply path is provided in a region surrounding the region where the first gas supply path is provided to supply a processing gas to a plurality of gas injection holes formed in the second region of the gas injection plate; the first gas supply path has a first gas diffusion space connected to a first gas line of the gas supply unit, a plurality of second gas lines, a second gas diffusion space, a plurality of third gas lines, and a third gas diffusion space which are connected in that order; the second gas supply path has a fourth gas diffusion space connected to a fourth gas line of the gas supply unit, a plurality of fifth gas lines, a fifth gas diffusion space, a plurality of sixth gas lines, and a sixth gas diffusion space which are connected in that order; wherein the second gas lines are arranged in a circumferential direction about the axis and have conductances lower than conductances of the first gas diffusion space and the second gas diffusion space; the third gas lines are arranged in the circumferential direction and have conductances lower than conductances of the second gas diffusion space and the third gas diffusion space; the fifth gas lines are arranged in the circumferential direction and have conductances lower than conductances of the fourth gas diffusion space and the fifth gas diffusion space; and the sixth gas lines are arranged in the circumferential direction and have conductances lower than conductances of the fifth gas diffusion space and the sixth gas diffusion space.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
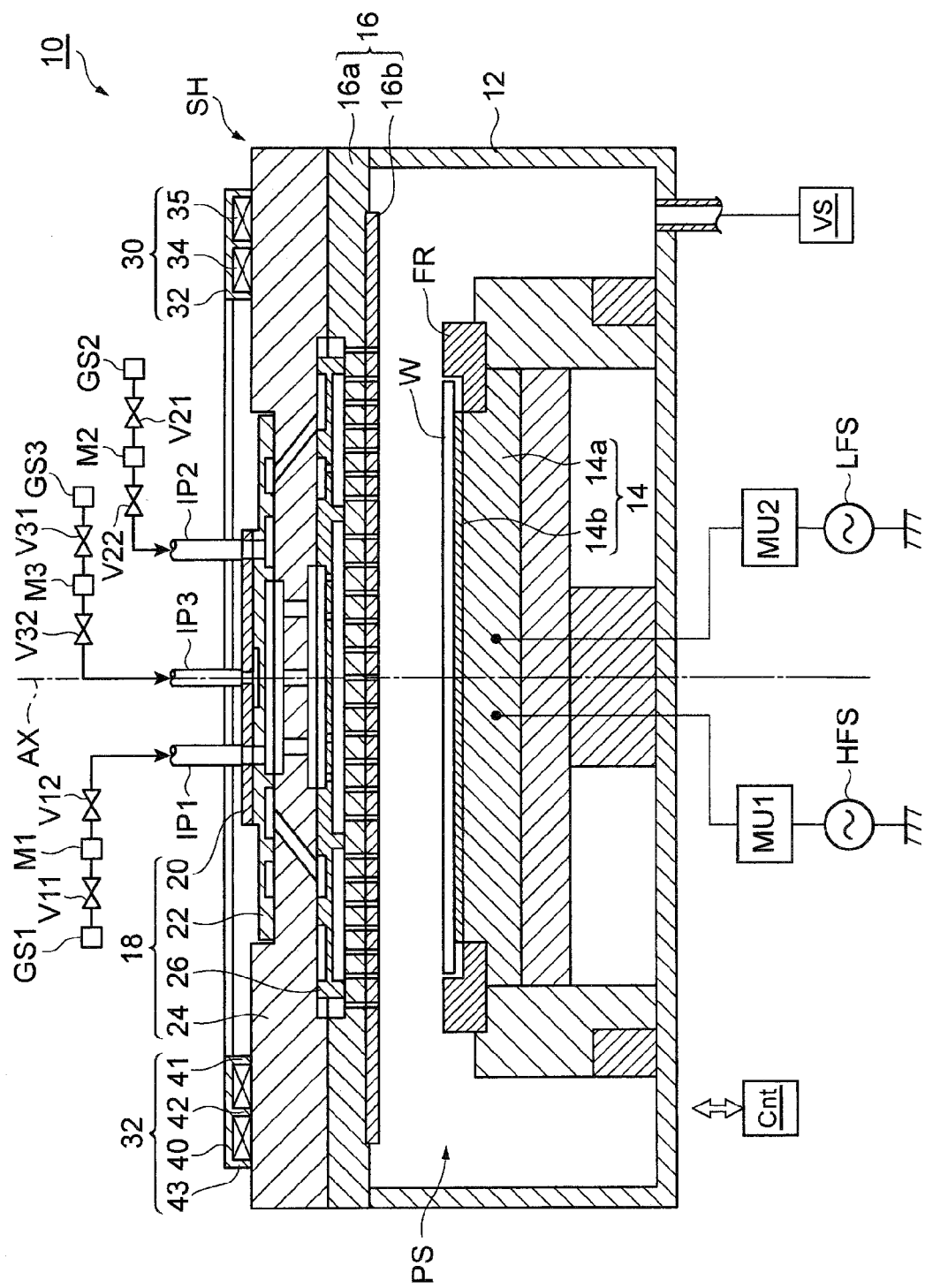
FIG. 1 is a cross sectional view schematically showing a plasma processing apparatus in accordance with an embodiment of the present invention.

Hereinafter, embodiments of the present invention will be described in detail with reference to the accompanying drawings which form a part hereof. Further, like reference numerals will be used for like or corresponding parts in all the drawings.

FIG. 1 schematically shows a plasma processing apparatus in accordance with an embodiment of the present invention. A plasma processing apparatus 10 shown in FIG. 1 may include a processing chamber 12, a mounting table 14, and a shower head SH. The processing chamber 12 is a substantially cylindrical container and a processing space PS is formed therein. A pressure in the processing space PS can be reduced by a gas exhaust unit VS.

The mounting table 14 is provided in the processing space PS. The mounting table 14 has a base 14a and an electrostatic chuck 14b. The base 14a is a conductive member such as aluminum and has a substantially disc shape. A focus ring FR is provided at a circumferential region of the top surface of the base 14a so as to surround the edge of the object (hereinafter, referred to as "wafer"). Further, an electrostatic chuck 14b is provided at a central region of the top surface of the base 14a.

The electrostatic chuck 14b has an electrode film serving as an inner layer of an insulating film, for example, and has a substantially disc shape. The wafer W is attracted and held on the electrostatic chuck 14b by an electrostatic force generated by a DC voltage supplied from a DC power supply to the electrode film via a switch. The top surface of the electrostatic chuck 14b serves as a mounting region for mounting thereon the wafer W. The wafer W is mounted on the mounting region of the electrostatic chuck 14b such that the center thereof coincides with an axis AX penetrating the center of the mounting region in a vertical direction.

The base 14a serves as a lower electrode. A high frequency power supply HFS for generating a high frequency power for plasma generation is connected to the base 14a via a first matching unit MU1. The high frequency power supply HFS generates a high frequency power having a frequency of about 100 MHz, for example. Further, the first matching unit MU1 has a circuit for matching an output impedance of the first matching unit MU1 and an input impedance of the load side (lower electrode side). In addition, the high frequency power supply HFS may be connected to the shower head SH serving as an upper electrode.

Further, a high frequency power supply LFS for generating a high frequency bias power for ion attraction is connected to the base 14a via a second matching unit MU2. The high frequency power supply LFS generates a high frequency power having a frequency of about 3.2 MHz, for example. Moreover, the second matching unit MU2 has a circuit for matching an output impedance of the second matching unit MU2 and an input impedance of the load side (lower electrode side).

The shower head SH is provided above the mounting table 14 so as to face the mounting table 14 via the processing space PS. In the present embodiment, the shower head SH serves as the upper electrode, and a high frequency electric field is generated between the shower head SH, i.e., the upper electrode, and the base 14a, i.e., the lower electrode, by a high frequency power supplied to the base 14a.

Figure 2:
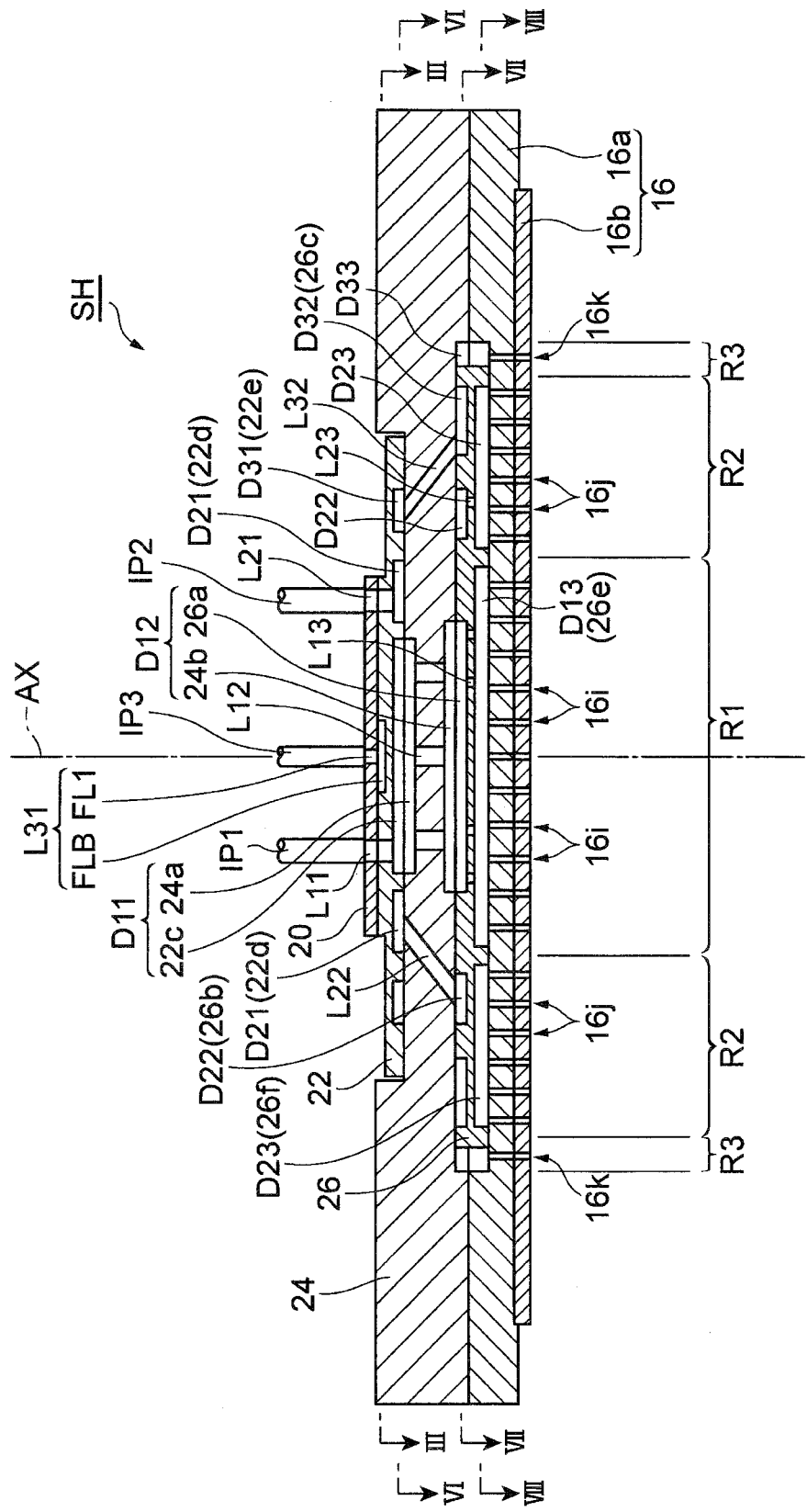
FIG. 2 is a cross sectional view schematically showing a shower head in accordance with an embodiment of the present invention.

FIG. 2 is a cross sectional view schematically showing a shower head in accordance with an embodiment of the present invention. Hereinafter, FIG. 2 will be referred to together with FIG. 1. The shower head SH has a gas injection plate 16 and a gas supply unit 18. The gas injection plate 16 has a substantially disc shape, and the central axis thereof coincides with the axis AX. The gas injection plate 16 faces the mounting table 14 via the processing space PS.

In the present embodiment, the gas injection plate 16 may include an upper plate portion 16a and a lower plate portion 16b. The upper plate portion 16a has a substantially disc shape and is made of, e.g., aluminum. A surface of the upper plate portion 16a may be subjected to alumite treatment or may have a film made of a material such as yttria. The lower plate portion 16b has a substantially disc shape and is coupled to the lower surface of the upper plate portion 16a. The lower plate portion 16b may be made of a material, e.g., silicon or quartz.

The gas injection plate 16 has a plurality of gas injection holes in each of a plurality of regions extending in a coaxial shape about the axis AX, which also can be regarded as the central axis of the gas injection plate 16 since the central axis thereof coincides with the axis AX. In the embodiment shown in FIG. 2, the gas injection plate 16 has three regions R1, R2, and R3. The region R1 is a disc-shaped region extending along the axis AX, which also can be regarded as the central axis of the gas injection plate 16. In the region R1, a plurality of gas injection holes 16i penetrating the gas injection plate 16 in the axis AX direction is formed. The gas injection holes 16i are distributed in the region R1 in a direction perpendicular to the axis AX. The region R1 is provided so as to face a region extending from the center of the wafer W to a region between the center and the edge of the wafer W.

The region R2 extends in a circumferential direction about the axis AX so as to surround the region R1. The region R2 is an annular region and extends such that the central axis thereof coincide with the axis AX. A plurality of gas injection holes 16j penetrating the gas injection plate 16 in the axis AX direction is formed in the region R2. The gas injection holes 16j are distributed in the region R2 in a direction perpendicular to the axis AX. The region R2 is provided so as to face the edge region including the edge of the wafer W.

Further, the region R3 extends in the circumferential direction so as to surround the region R2. The region R3 is an annular region and extends such that the central axis thereof coincides with the axis AX. A plurality of gas injection holes 16k penetrating the gas injection plate 16 in the axis AX direction. The gas injection holes 16k are distributed in the region R3 in a direction perpendicular to the axis AX. The region R3 is provided so as to face a region outer than the edge of the wafer W, e.g., the focus ring FR.

A processing gas is supplied to each of the regions R1 to R3 by the gas supply unit 18. Therefore, in the plasma processing apparatus 10, the gas supply unit 18 has first to third gas supply paths arranged in a coaxially about the axis AX.

The first gas supply path supplies the processing gas from the gas source GS1 to the gas injection holes 16i of the first region R1. The gas source GS1 is connected to a gas inlet line IP1 via a valve V11, a flow rate controller M1 such as a mass flow controller, and a valve V12. The processing gas from the gas source GS1 is introduced into the first gas supply path through the gas inlet line IP1. The gas inlet line IP1 extends while being spaced apart from the axis AX and is connected to the shower head SH.

The second gas supply path supplies the processing gas from the gas source GS2 to the gas injection holes 16j of the second region R2. The gas source GS2 is connected to a gas inlet line IP2 via a valve V21, a flow rate controller M2 such as a mass flow controller, and a valve V22. The processing gas from the gas source GS2 is introduced into the second gas supply path through the gas inlet lint IP2. The gas inlet line IP2 extends while being further spaced apart from the axis AX in comparison to the gas inlet line IP1 and is connected to the shower head SH.

The third gas supply path supplies the processing gas from the gas source GS3 to the gas injection holes 16k of the second region R3. The gas source GS3 is connected to a gas inlet line IP3 via a valve V31, a flow rate controller M3 such as a mass flow controller, and a valve V32. The processing gas from the gas source GS3 is introduced into the third gas supply path through gas inlet lint IP3. The gas inlet line IP3 extends along the axis AX and is connected to the shower head SH.

Although the first to the third gas supply path are connected to different gas sources in the embodiment described in FIGS. 1 and 2, a processing gas distributed from a common gas source may be supplied to at least two of the first to the third gas supply path.

Figure 3:
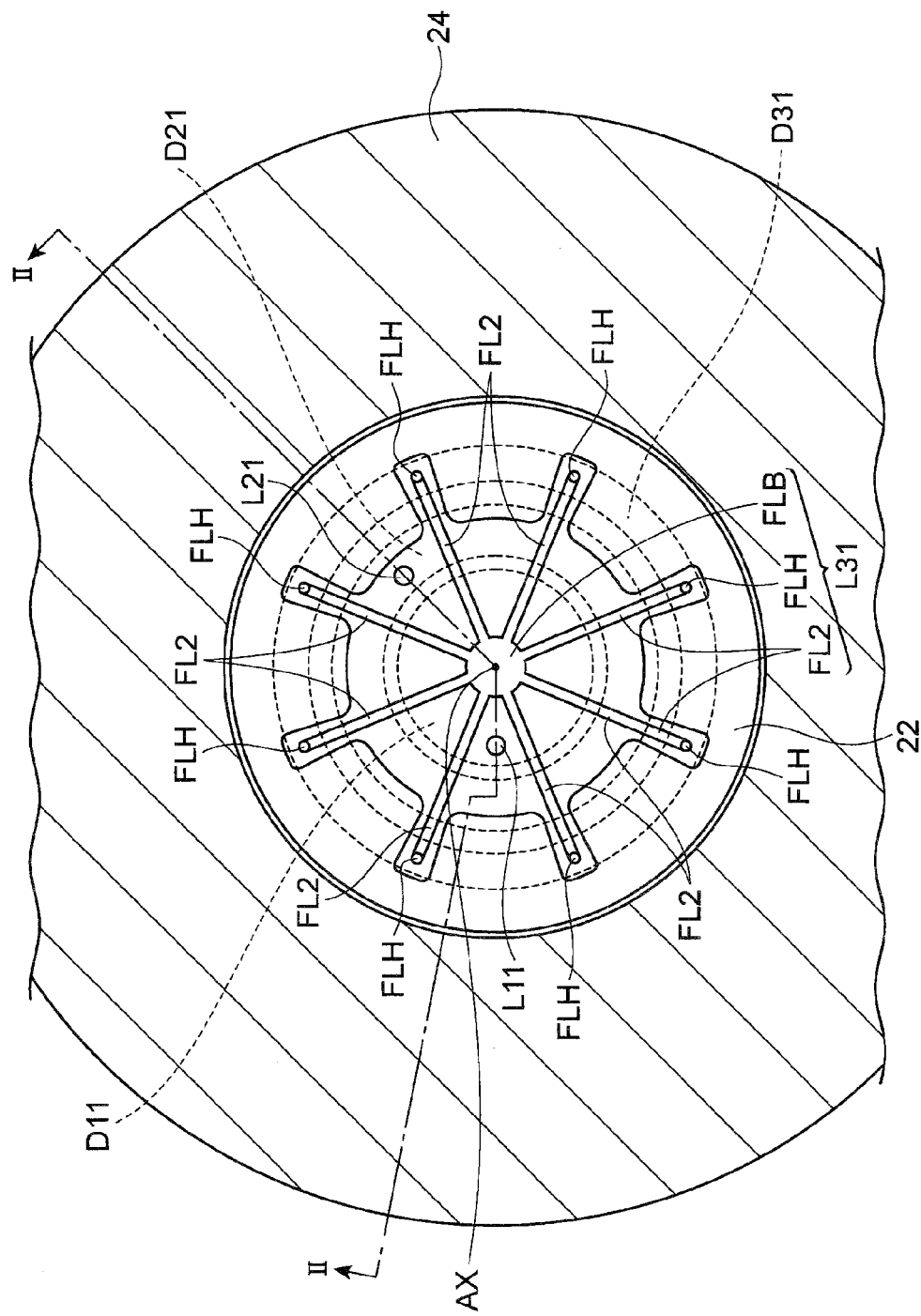
FIG. 3 is a cross sectional view of the shower head taken along line in FIG. 2.
Figure 4:
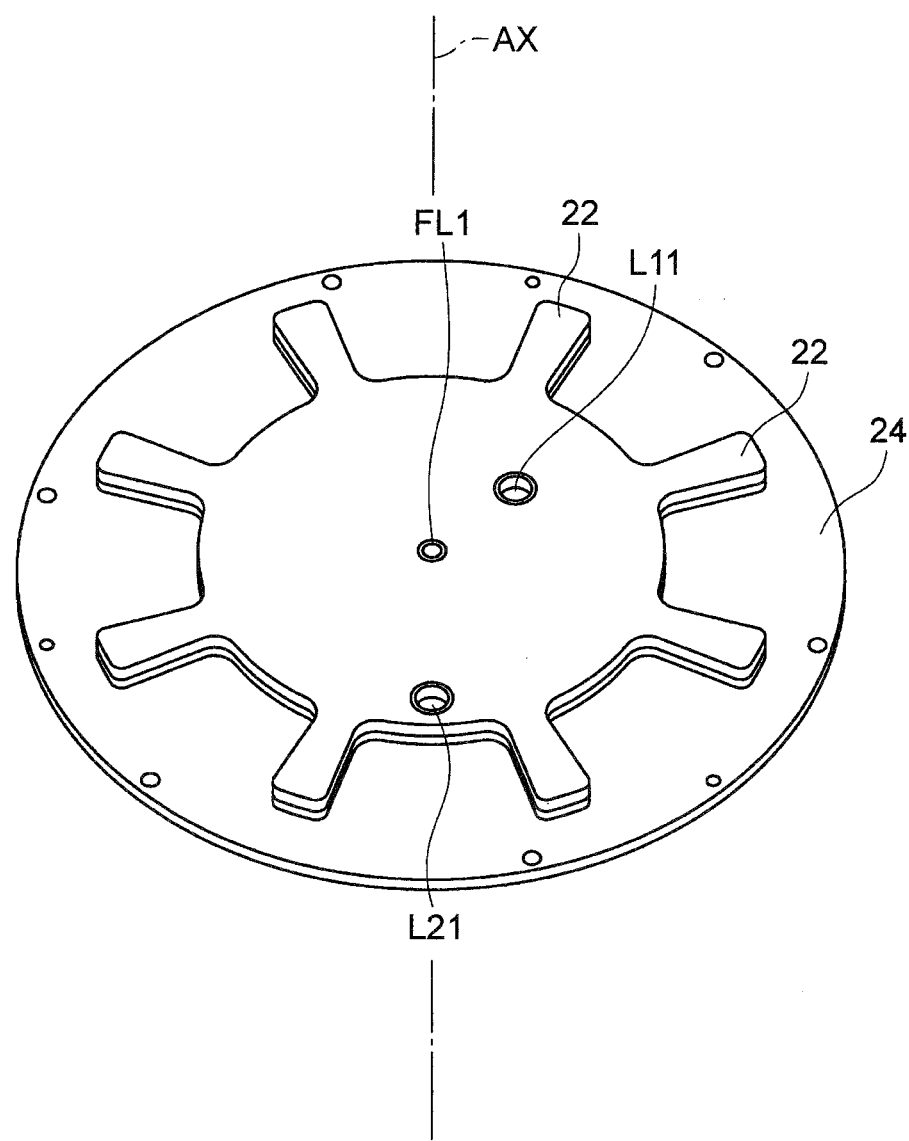
FIG. 4 is a perspective view showing a connection state of a first member and a second member of the shower head.
Figure 5:
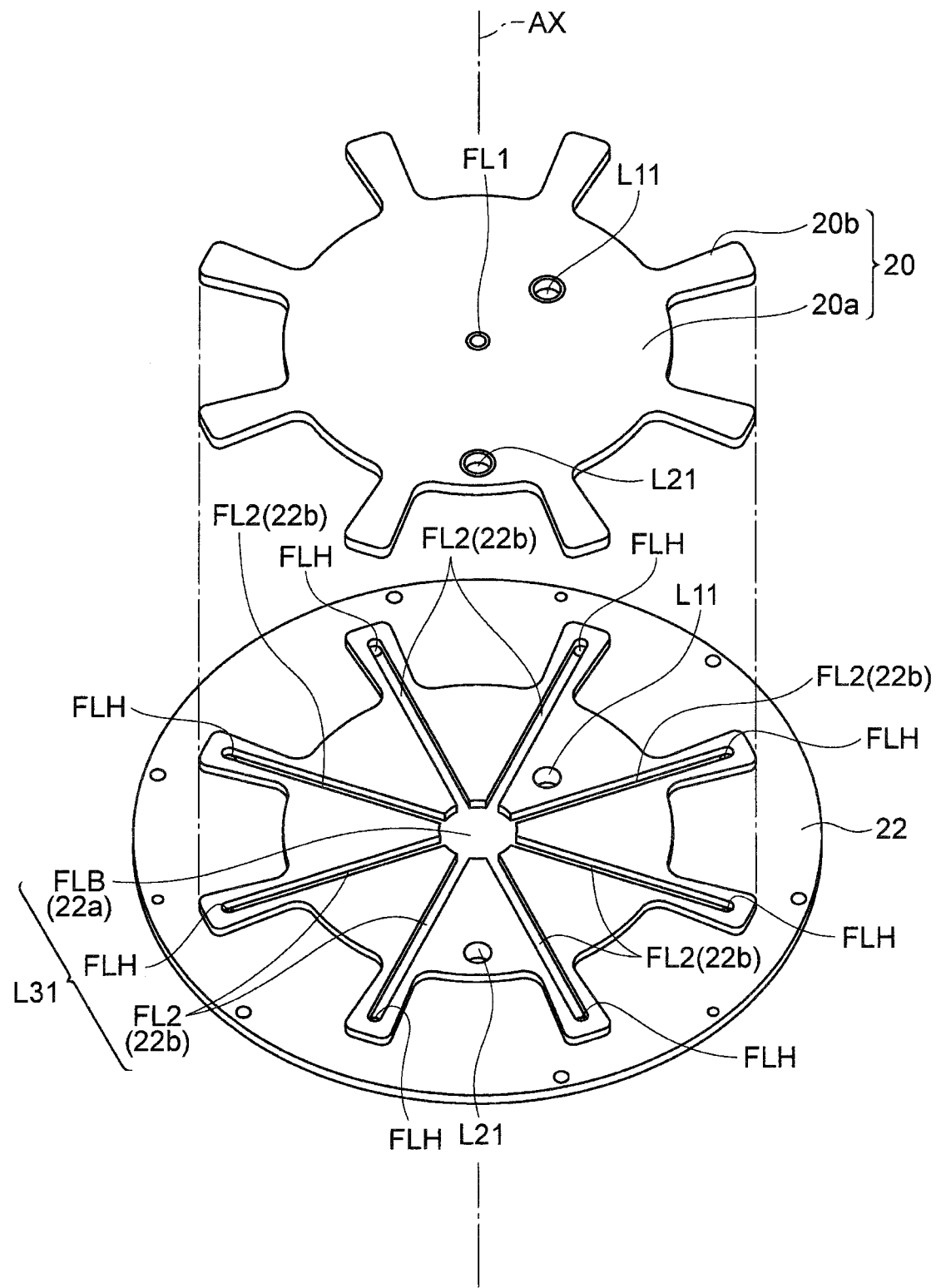
FIG. 5 is an exploded perspective view of the first and the second member of the shower head.
Figure 6:
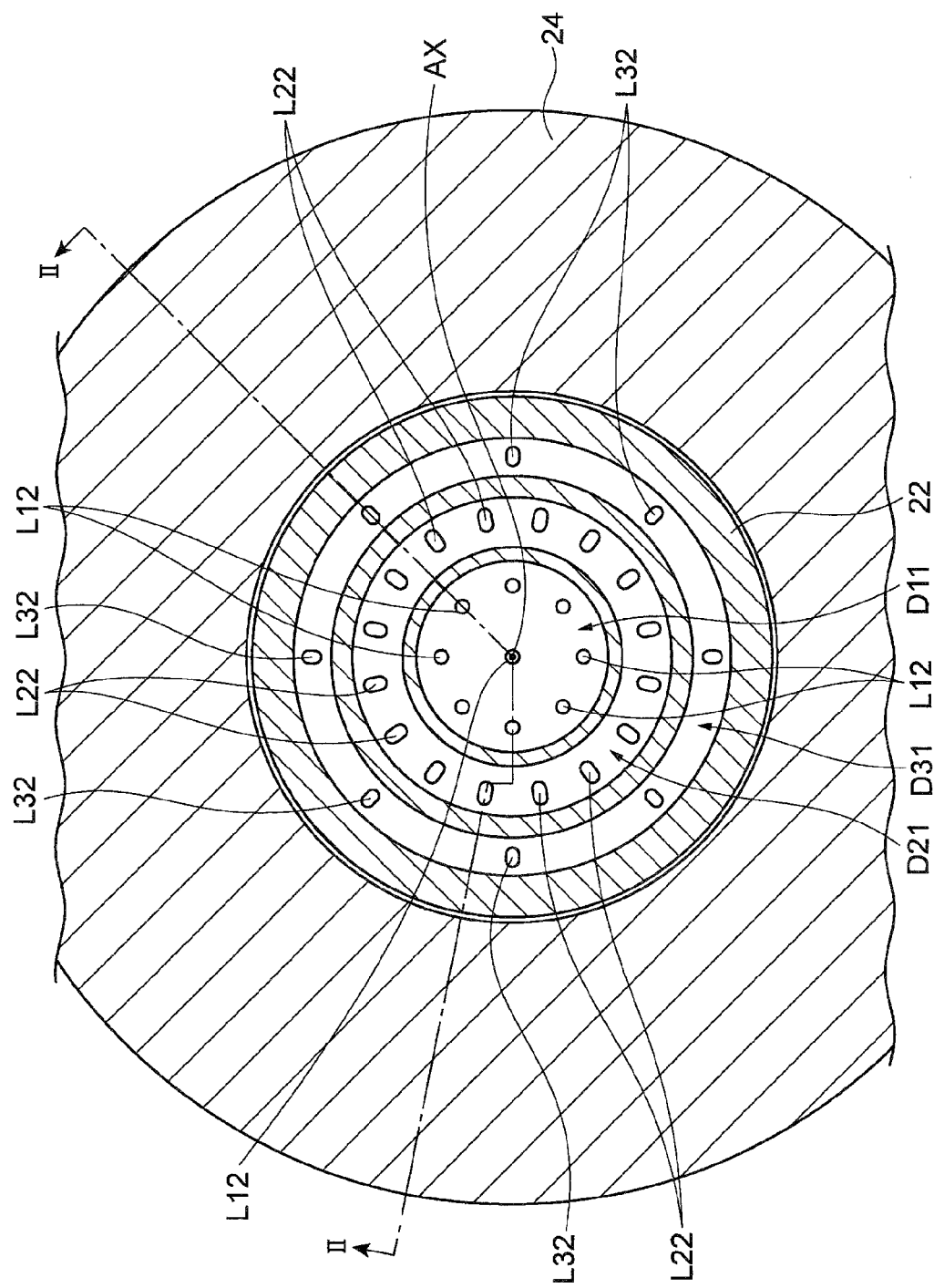
FIG. 6 is a cross sectional view of the shower head taken along line VI-VI in FIG. 2.
Figure 7:
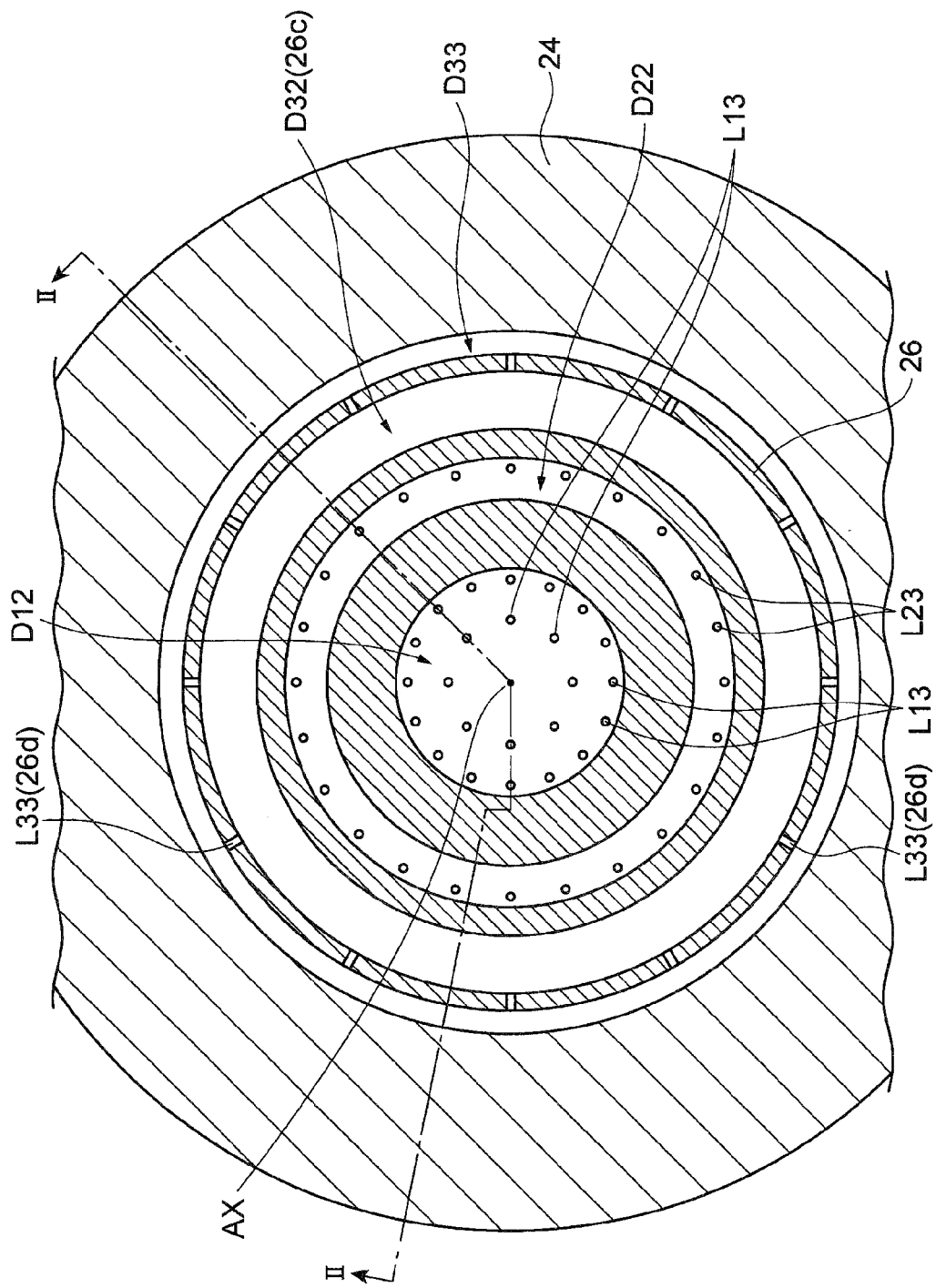
FIG. 7 is a cross sectional view of the shower head taken along line VII-VII in FIG. 2.
Figure 8:
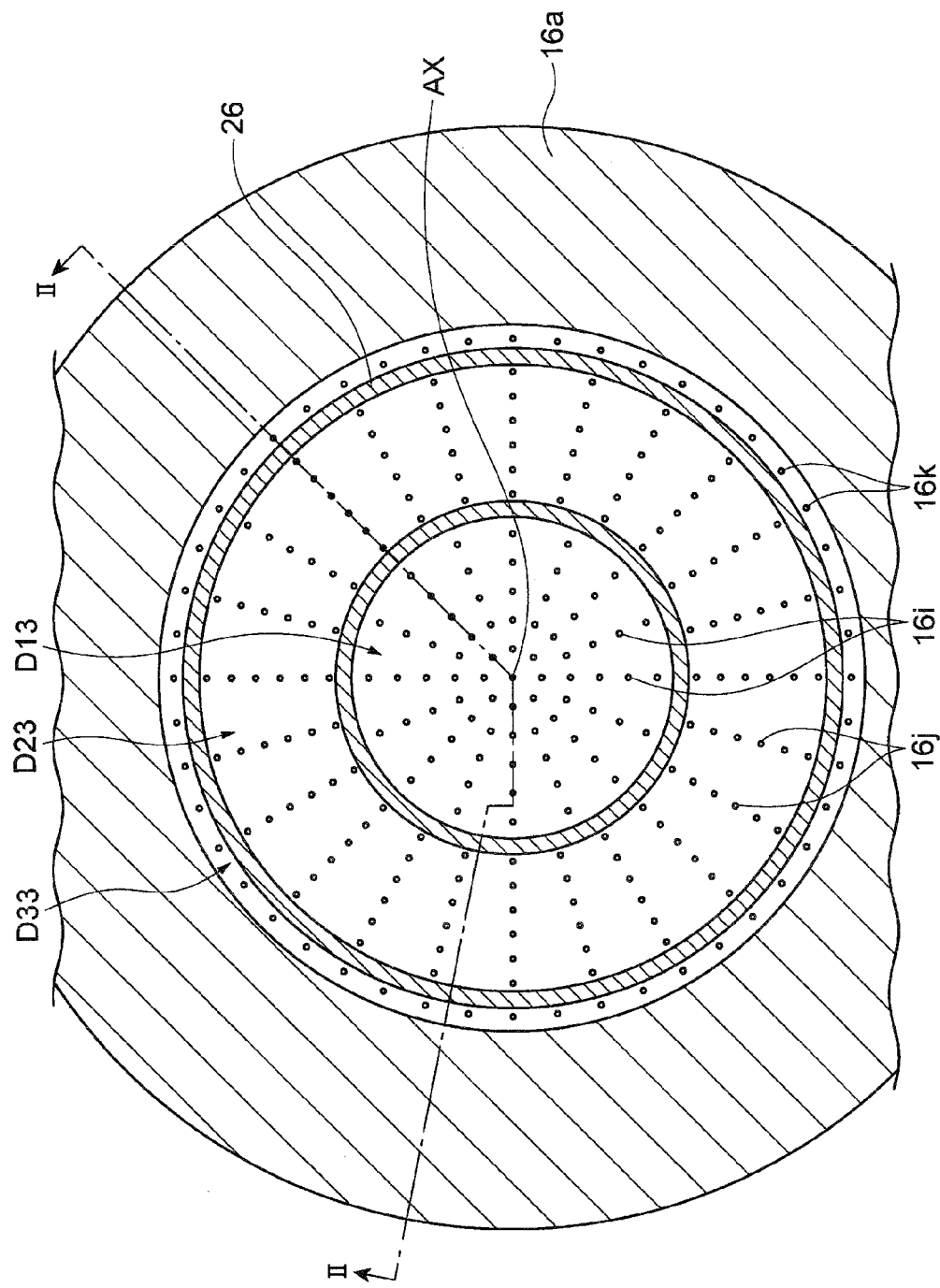
FIG. 8 is a cross sectional view of the shower head taken along line VIII-VIII in FIG. 2.

Hereinafter, the first to the third gas supply path of the shower head SH will be described with reference to FIGS. 3 to 8 as well as FIGS. 1 and 2. FIG. 3 is a cross sectional view of the shower head SH taken along line III-III of FIG. 2. FIG. 3 shows the cross section seen from the top which is taken along the same plane as the top surface of a second member 22 to be described later. FIG. 4 is a perspective view showing the connection state of the first member and the second member of the shower head. FIG. 5 is an exploded perspective view of the first and the second member of the shower head SH. FIG. 6 is a cross sectional view of the shower head SH taken along line VI-VI in FIG. 2. FIG. 6 shows the cross section, seen from the top, which is taken along a line extending on an intermediate plane of the height direction (i.e., the axis AX direction) of a first gas diffusion space D11, a fourth gas diffusion space D21 and a seventh gas diffusion space D31. FIG. 7 is a cross sectional view of the shower head SH taken along line VII-VII in FIG. 2. FIG. 7 shows the cross section, seen from the top, which is taken along a line extending on an intermediate plane of the height direction of a second gas diffusion space D12, a fifth gas diffusion space D22 and an eighth gas diffusion space D32. FIG. 8 is a cross sectional view of the shower head SH taken along line VIII-VIII in FIG. 2. FIG. 8 shows the cross section, seen from the top, which is taken along a line extending on an intermediate plane of the height direction of a third gas diffusion space D13, a sixth gas diffusion space D23 and a ninth diffusion space D33. In addition, the cross sections shown in FIGS. 1 and 2 correspond to the vertical cross sections taken along line II-II of FIGS. 3 and 6 to 8.

As shown in FIGS. 1 to 8, the gas supply unit 18 has, as components of the first gas supply path, the first gas diffusion space D11, a plurality of second gas lines L12, the second gas diffusion space D12, a plurality of third gas lines L13 and the third gas diffusion space D13. Further, the gas supply unit 18 has, as components of the second gas supply path, the fourth gas diffusion space D21, a plurality of fifth gas lines L22, the fifth gas diffusion space D22, a plurality of sixth gas lines L23 and the sixth gas diffusion space D23. Moreover, the gas supply unit 18 has, as components of the third gas supply path, the seventh gas diffusion space D31, a plurality of eighth gas lines L32, the eighth gas diffusion space D32, a plurality of ninth gas lines L33 and the ninth gas diffusion space D33.

The first gas supply path is provided in the region along the axis AX and is formed by connecting the first gas diffusion space D11, the second gas lines L12, the second gas diffusion space D12, the third gas lines L13 and the third gas diffusion space D13 in that order from the upstream side. The first gas diffusion space D11 is connected to a gas line L11. The gas line L11 is a gas inlet line to which a gas from the outside of the shower head SH is supplied, and is connected to the gas inlet line IP1 as shown in FIG. 2. The gas line L11 is spaced apart from the axis AX and extends substantially in parallel to the axis AX.

As shown in FIGS. 2 and 6, the gas diffusion space D11 is a substantially disc-shaped space extending along the axis AX, and is provided such that the central axis thereof coincides with the axis AX. As shown in FIG. 2, a gas diffusion space D12 is provided at the downstream of the gas diffusion space D11 and the upstream of the gas diffusion space D13. In other words, the gas diffusion space D12 is provided below the gas diffusion space D11, and the gas diffusion space D13 is provided below the gas diffusion space D12. The gas diffusion space D13 is provided immediately above the first region R1 and is connected to the gas injection holes 16i. As shown in FIGS. 2, 7 and 8, both of the gas diffusion spaces D12 and D13 are substantially disc-shaped spaces extending perpendicularly to the axis AX and the center axes of the gas diffusion spaces D12 and D13 coincide with the axis AX.

As shown in FIG. 2, the gas lines L12 are provided between the gas diffusion space D11 and the gas diffusion space D12. As shown in FIGS. 2 and 6, the gas lines L12 extend in substantially parallel to the axis AX and are arranged in the circumferential direction about the axis AX. In the present embodiment, one of the gas lines L12 extends along the axis AX, and the other gas lines L12 are arranged at a regular interval in the circumferential direction about the axis AX. The gas lines L12 have one ends connected to the gas diffusion space D11 and the other ends connected to the gas diffusion space D12. The gas lines L12 have conductances lower than those of the gas diffusion spaces D11 and D12.

As shown in FIG. 2, the gas lines L13 are provided between the gas diffusion space D12 and the gas diffusion space D13. As shown in FIGS. 2 and 7, the gas lines L13 extend in substantially parallel to the axis AX and are arranged in the circumferential direction about the axis AX. In the present embodiment, one of the gas lines L13 extends along the axis AX, and the other gas lines L13 are arranged at a regular interval in the circumferential direction along two circles about the axis AX. The gas lines L13 have one ends connected to the gas diffusion space D12 and the other ends connected to the gas diffusion space D13. The gas lines L13 have conductances lower than those of the gas diffusion spaces D12 and D13.

The second gas supply path is provided in a region surrounding the region where the first gas supply path is provided about the axis AX, and is formed by connecting the fourth gas diffusion space D21, the fifth gas lines L22, the fifth gas diffusion space D22, the sixth gas lines L23 and the sixth gas diffusion space D23 in that order from the upstream side. The fourth gas diffusion space D21 is connected to a gas line L21 of the gas supply unit 18. The gas line L21 is a gas input line to which the gas from the outside of the shower head SH is supplied and is connected to the gas inlet line 1P2 as shown in FIG. 2. The gas line L21 is further spaced apart from the axis AX in comparison to the gas line L11 and extends in substantially parallel to the axis AX. The gas line L21 is connected to the gas diffusion space D21 provided at the downstream side thereof.

As shown in FIGS. 2 and 6, the gas diffusion space D21 is a substantially annular space and the central axis thereof coincides with the axis AX. The gas diffusion space D21 extends in a circumferential direction at the outer side of the gas diffusion space D11 about the axis AX. As shown in FIG. 2, the gas diffusion space D22 is provided at the downstream of the gas diffusion space D21 and the upstream of the gas diffusion space D23.

As shown in FIGS. 2 and 7, the gas diffusion space D22 is a substantially annular plate-shaped space and extends in the circumferential direction at a position obliquely below the outer side of the gas diffusion space D21. The gas diffusion space D22 is provided at the outer side of the gas diffusion space D12 so as to surround the gas diffusion space D12. Further, the gas diffusion space D22 extends while being further spaced apart from the axis AX in comparison to the gas diffusion space D21.

As shown in FIGS. 2 and 8, the gas diffusion space D23 is provided immediately above the aforementioned second region R2 and is connected to the gas injection holes 16j. The gas diffusion space D23 is a substantially annular plate-shaped space and extends below the gas diffusion space D22 in the circumferential direction about the axis AX.

As shown in FIG. 2, the gas lines L22 are provided between the gas diffusion space D21 and the gas diffusion space D22. As shown in FIGS. 2 and 6, the gas lines L22 extend obliquely so as to be further spaced apart from the axis AX as they go toward the bottom and are arranged in the circumferential direction about the axis AX. In the present embodiment, the gas lines L22 are arranged so as to be distributed in the circumferential direction about the axis AX. Further, in the present embodiment, the gas lines L22 are arranged at a regular interval in the circumferential direction about the axis AX. The gas lines L22 have one ends connected to the gas diffusion space D21 and the other ends connected to the gas diffusion space D22. The gas lines L22 have conductances lower than those of the gas diffusion spaces D21 and D22.

As shown in FIG. 2, the gas lines L23 are provided between the gas diffusion space D22 and the gas diffusion space D23. As shown in FIGS. 2 and 7, the gas lines L23 extend in substantially parallel to the axis AX and are arranged in the circumferential direction about the axis AX. In the present embodiment, the gas lines L23 are arranged in the circumferential direction about the axis AX. In the present embodiment, the gas lines L23 are arranged at a regular interval in the circumferential direction along the circle about the axis AX. The gas lines L23 have one ends connected to the gas diffusion space D22 and the other ends connected to the gas diffusion space D23. The gas lines L23 have conductances lower than those of the gas diffusion spaces D22 and D23.

The third gas supply path is provided in a region surrounding the outer side of the region where the second gas supply path is provided about the axis AX, and is formed by connecting the seventh gas diffusion space D31, the eighth gas lines L32, the eighth gas diffusion space D32, the ninth gas lines L33, and the ninth gas diffusion space D33 in that order from the upstream. The seventh gas diffusion space D31 is connected to a gas line L31 of the gas supply unit 18. The gas line L31 serves as a gas input line to which a gas from the outside of the shower head SH is supplied. The gas line L31 is connected to the gas inlet line IP3 as shown in FIG. 2.

As shown in FIGS. 2 and 3, the gas line L31 includes a first flow path FL1 and a plurality of second flow paths FL2. In the present embodiment, the gas line L31 includes a gas branch portion FLB and a plurality of through holes FLH. The first flow path FL1 extends along the axis AX. The first flow path has one end connected to the gas inlet line IP3 and the other end connected to the gas branch portion FLB.

The gas branch portion FLB is a substantially disc shaped space, and the second flow paths FL2 are branched from the first flow path FL1 at the gas branch portion FLB. In other words, the second flow paths FL2 are connected to the first flow path FL1 at one end of the axis AX via the gas branch portion FLB. Further, the second flow paths FL2 extend in a radial direction about the axis AX and are distributed in the circumferential direction about the axis AX. In the present embodiment, the through holes FLH extending in substantially parallel to the axis AX are respectively connected to the other ends of the second flow paths FL2. The through holes FLH are connected to the gas diffusion space D31 provided below the through holes FLH.

As shown in FIGS. 2, 3 and 6, the gas diffusion space D31 is a substantially annular plate-shaped space and the central axis thereof coincides with the axis AX. The gas diffusion space D31 extends at the outer side of the gas diffusion space D21 in the circumferential direction about the axis AX. As shown in FIG. 2, the gas diffusion space D32 is provided at the downstream of the gas diffusion space D31 and the upstream of the gas diffusion space D33.

As shown in FIGS. 2 and 7, the gas diffusion space D32 is a substantially annular plate-shaped space and extends in the circumferential direction at a position obliquely below the outer side of the gas diffusion space D31. The gas diffusion space D32 is provided at the outer side of the gas diffusion space D22 so as to surround the gas diffusion space D22. Further, the gas diffusion space D32 extends while being further spaced apart from the axis AX in comparison to the gas diffusion space D31.

As shown in FIGS. 2 and 8, the gas diffusion space D33 is provided immediately above the aforementioned third region R3 and connected to the gas injection holes 16k. The gas diffusion space D33 is a substantially annular plate-shaped space and extends in the circumferential direction such that the upper portion thereof surrounds the gas diffusion space D32 and the lower portion thereof surrounds the gas diffusion space D23.

As shown in FIG. 2, the gas lines L32 are provided between the gas diffusion space D31 and the gas diffusion space D32. As shown in FIGS. 2 and 6, the gas lines L32 extend obliquely so as to be spaced apart from the axis AX toward the bottom, and are arranged in the circumferential direction about the axis AX. In the present embodiment, the gas lines L32 are arranged so as to be distributed in the circumferential direction about the axis AX. In the present embodiment, the gas lines L32 are arranged at a regular interval in the circumferential direction about the axis AX. The gas lines L32 have one ends connected to the gas diffusion space D31 and the other ends connected to the gas diffusion space D32. The gas lines L32 have conductances lower than conductances of the gas diffusion space D31 and the gas diffusion space D32.

Further, as shown in FIG. 7, the gas lines L33 are provided between the gas diffusion space D32 and the gas diffusion space D33. The gas lines L33 extend radially about the axis AX and are arranged in the circumferential direction about the axis AX. In the present embodiment, the gas lines L33 are arranged so as to be distributed in the circumferential direction about the axis AX. In the present embodiment, the gas lines L33 are arranged at a regular interval in the circumferential direction about the axis AX. The gas lines L33 have one ends connected to the gas diffusion space D32 and the other ends connected to the gas diffusion space D33. The gas lines L33 have conductances lower than those of the gas diffusion space D32 and the gas diffusion space D33.

As shown in FIGS. 2 to 8, in the present embodiment, the gas supply unit 18 includes a first and a second member 20 forming an upper member, an intermediate member 23, and a lower member 26. The gas supply unit 18 is formed by laminating the upper member, the intermediate member 24 and the lower member 26.

The first and the second member 20 and 22 are made of stainless steel. The bottom surface of the first member and the top surface of the second member 22 are connected to each other by diffusion bonding, so that the first and the second member 20 and 22 as one unit form the upper member. As shown in FIGS. 3 and 5, the second member 22 has a substantially disc shape, and a substantially disc shaped recess 22a serving as the gas branch portion FLB and a plurality of grooves 22b serving as the second flow paths FL2 are formed on the top surface thereof. The recess 22a is formed along the axis AX. The grooves 22b are connected to the recess 22a at one ends thereof and extend in a radial direction about the axis AX. Further, a plurality of through holes FLH is formed in the second member 22 and connected to the other ends of the grooves 22b, respectively.

The first member 20 includes a substantially disc shaped central portion 20a, and a plurality of protrusions 20b extending in a radial direction from the central portion 20a. A first flow path FL1 extending along the axis AX is formed at the central portion 20a. When the first and the second member 20 and 22 are connected to each other, the first flow path FL1 is connected to the recess 22a, i.e., the gas branch portion FLB. Further, the first and the second member 20 and 22 have gas lines L11 and L22 penetrating therethrough in the axial AX direction.

Further, when the first member 20 and the second member 22 are coupled to each other, the central portion 20a and the protrusions 20b of the first member 20 cover the upper openings of the recess 22a and the grooves 22b of the second member 22. Accordingly, the gas branch portion FLB and the second flow paths FL2 are formed. By connecting the first and the second member 20 and 22 by diffusion bonding, the gas lines L11 to L31 can be formed without using a sealing member. As a result, the thickness of the complex forming the gas lines can be reduced.

As shown in FIGS. 2 and 6, a recess 22c and annular grooves 22d and 22e are formed on the bottom surface of the second member 22. The recess 22c is a substantially disc shaped space and is provided along the axis AX. When the upper member formed of the first member 20 and the second member 22 is mounted on the intermediate member 24, the recess 22c serves as the upper portion of the gas diffusion space D11. The annular groove 22d extends in the circumferential direction about the axis AX and is provided between the recess 22c and the annular groove 22e. The annular groove 22e extends at the outer side of the annular groove 22d in the circumferential direction. When the upper member formed of the first and the second member 20 and 22 is mounted on the intermediate member 24, the annular grooves 22d and 22e serve as the gas diffusion spaces D21 and D31.

As shown in FIG. 2, the intermediate member 24 has a substantially disc shape and is made of metal, e.g., aluminum. A recess 24a is formed on the top surface of the intermediate member 24. The recess 24a is a substantially disc shaped space and extends along the axis AX. When the upper member formed of the first and the second member 20 and 22 is mounted on the intermediate member 24, the recess 24a communicates with the recess 22c and serves as the lower portion of the gas diffusion space D11. In other words, the recess 24a serves as an extension region for extending the gas diffusion space D11.

The intermediate member 24 has the gas lines L12, L22 and L32 penetrating therethrough. Further, a recess 24b is formed on the bottom surface of the intermediate member 24. The recess 24b is a substantially disc shaped space and is provided along the axis AX. When the intermediate member 24 is mounted on the lower member 26, the recess 24b serves as the upper portion of the gas diffusion space D12. In other words, the recess 24b serves as an extension region for extending the gas diffusion space D12.

The lower member 26 is a substantially disc shaped member and is made of, e.g., aluminum. A recess 26a and annular grooves 26b and 26c are formed on the top surface of the lower member 26. The recess 26a is a substantially disc shaped space and is disposed along the axis AX. When the intermediate member 24 is mounted on the lower member 26, the recess 26a communicates with the recess 24b and serves as the lower portion of the gas diffusion space D12.

The annular groove 26b extends in the circumferential direction about the axis AX and is provided between the recess 26a and the annular groove 26c. The annular groove 26c extends in the circumferential direction at the outer side of the annular groove 26b. When the intermediate member 24 is mounted on the lower member 26, the annular groove 26b and the annular groove 26c serve as the gas diffusion space D22 and the gas diffusion space D32, respectively.

Further, as shown in FIG. 7, a plurality of grooves 26d extending from the annular groove 26c to the outer peripheral surface of the lower member 26 in a radial direction about the axis AX is formed on the top surface of the lower member 26. When the intermediate member 24 is mounted on the lower member 26, upper openings of the grooves 26d are blocked by the intermediate member 24. Accordingly, the grooves 26d serve as the gas lines L33 for connecting the gas diffusion space D32 and the gas diffusion space D33.

As shown in FIG. 2, the lower member 26 has the gas lines L13 and L23 penetrating therethrough. A recess 26e and an annular groove 26f are formed on the bottom surface of the lower member 26. The recess 26e is a substantially disc shaped space and is provided along the axis AX. When the lower member 26 is mounted on the gas injection plate 16, the recess 26e serves as the gas diffusion space D13. Further, the annular groove 26f extends in the circumferential direction about the axis AX so as to surround the recess 26e. When the lower member 26 is mounted on the gas injection plate 16, the annular grove 26f serves as the gas diffusion space D23.

As shown in FIG. 2, a substantially disc shaped space for accommodating the lower member 26 is formed between the intermediate member 24 and the gas injection plate 16. The diameter of the space is greater than the diameter of the lower member 26, and the gas diffusion space D33 is formed by the outer peripheral surface of the lower member 26 and the wall surface forming the aforementioned space.

Although it is not shown in FIG. 2, a sealing member extending in the circumferential direction between the gas diffusion spaces D11 and D21 may be provided between the second member 22 and the intermediate member 24 in order to ensure airtightness of the gas diffusion space D11 and the gas diffusion space D21. Further, a sealing member extending in the circumferential direction between the gas diffusion space D21 and the gas diffusion space D31 may be provided between the second member 22 and the intermediate member 24 in order to ensure airtightness of the gas diffusion space D21 and the gas diffusion space D31. Moreover, a sealing member extending in the circumferential direction along the outer periphery of the gas diffusion space D31 may be provided between the second member 22 and the intermediate member 24 in order to ensure airtightness of the gas diffusion space D31.

Further, a sealing member extending in the circumferential direction between the gas diffusion spaces D12 and D22 may be provided between the intermediate member 24 and the lower member 26 in order to ensure airtightness of the gas diffusion space D12 and the gas diffusion space D22. Furthermore, a sealing member extending in the circumferential direction between the gas diffusion space D22 and the gas diffusion space D32 may be provided between the intermediate member 24 and the lower member 26 in order to ensure airtightness of the gas diffusion space D22 and the gas diffusion space D32.

Moreover, in order to ensure airtightness of the gas diffusion space D31 and the gas diffusion space D32, a sealing member extending in the circumferential direction between the gas diffusion space D31 and the gas diffusion space D32 may be provided between the lower member 26 and the upper plate portion 16a. Further, a sealing member extending in the circumferential direction between the gas diffusion space D32 and the gas diffusion space D33 may be provided between the lower member 26 and the upper plate portion 16a in order to ensure airtightness of the gas diffusion space D32 and the gas diffusion space D33. Furthermore, a sealing member extending in the circumferential direction along the outer periphery of the gas diffusion space D33 may be provided between the intermediate member 24 and the upper plate portion 16a in order to ensure airtightness of the gas diffusion space D33.

In the first gas supply path of the shower head SH as described above, the second gas lines L12 having a low conductance are arranged in the circumferential direction between the first gas diffusion space D11 and the second gas diffusion space D12, and the third gas lines L13 having a low conductance are arranged in the circumferential direction between the second gas diffusion space D12 and the third gas diffusion space D13. In the second gas supply path, the fifth gas lines L22 having a low conductance are arranged in the circumferential direction between the fourth gas diffusion space D21 and the fifth gas diffusion space D22, and the sixth gas lines L23 having a low conductance are arranged in the circumferential direction between the fifth gas diffusion space D22 and the sixth gas diffusion space D23.

In this shower head SH, the connecting position of the first gas line L11 to the first gas diffusion space D11 is spaced apart from the axis AX, so that the conductances from the connecting position of the first gas line L11 to the first gas diffusion space D11 to the connecting positions of the second gas lines L12 to the first gas diffusion space D11 are different. However, in this shower head SH, the combined conductance from the connecting position of the first gas line L11 to the first gas diffusion space D11 to each of the gas injection holes 16i mainly depends on the conductances of the second and the third gas line L12 and L13. The contribution of the conductances of the second and the third gas line L12 and L13 to the combined conductance from the first gas line L11 to each of the gas injection holes 16j of the first region R1 is substantially the same. Accordingly, the difference in the combined conductance from the connection position of the first gas line L11 to the first gas diffusion space D11 to each of the gas injection holes 16i of the first region R1 is reduced. As a result, the difference in the flow rates of the gases from the gas injection holes 16i of the first region R1 is reduced.

In the same manner, the connecting position of the fourth gas line L21 to the fourth gas diffusion space D21 is spaced apart from the axis AX, so that the conductances from the connecting position of the fourth gas line L21 to the fourth gas diffusion space D21 to the connecting positions of the fifth gas lines L22 to the fourth gas diffusion space D21 are different. However, in this shower head SH, the combined conductance from the connecting position of the fourth gas line L21 to the fourth gas diffusion space D21 to each of the gas injection holes 16j mainly depends on the conductances of the fifth and the sixth gas line L22 and L23. The contribution of the conductances of the fifth gas line L22 and the sixth gas line L23 to the combined conductance from the connecting position of the fourth gas line L21 to each of the gas injection holes 16j in the second region R2 is substantially the same. Therefore, the difference in the combined conductance from the connecting position of the fourth gas line L21 to the fourth gas diffusion space D21 to each of the gas injection holes 16j in the second region R2 is reduced. As a result, the difference in the flow rates of the gases from the gas injection holes 16j in the second region R2 is reduced.

In addition, each of the first and the second gas supply path has three gas diffusion spaces, so that the volumes of the first gas supply path and the second gas supply path can become substantially the same. Here, the time from the input of the gas to the shower head to the injection of the gas from the gas injection holes depends on the volume of the gas supply path. Therefore, in accordance with this shower head SH, it is possible to reduce the difference in the time from the input of the gas to the shower head SH to the injection of the gas from the corresponding gas injection holes via the first and the second gas supply path.

Further, the seventh gas line L31 has the first flow path FL1 extending along the axis AX and the second flow paths FL2 extending in a radial direction from the axis AX and disposed in the circumferential direction. In other words, the seventh gas line L31 to which a gas from the outside is supplied is connected to the seventh gas diffusion space D31 by a plurality of paths having the substantially same conductance and distributed in the circumferential direction. Therefore, the difference in the combined conductances from the seventh gas line L31 to the gas injection holes 16k in the third region R3 is essentially reduced. Further, as in the case of the first and the second gas supply path, the third gas supply path has three gas diffusion spaces, so that the volumes of the first to the third gas supply path can become substantially the same. Accordingly, in accordance with this shower head SH, it is possible to reduce the difference in time from the input of the gas to the shower head SH to the injection of the gas from the corresponding gas injection holes via the first to the third gas supply path.

Moreover, in accordance with the plasma processing apparatus 10 including this shower head SH, it is possible to reduce the difference in the flow rates of the gases injected from the gas injection holes 16i to 16k in the first to the third region R1 to R3, and also possible to reduce the difference in time from the input of the gas to the shower head SH to the injection of the gas from the corresponding gas injection holes 16i to 16k via the first to the third gas supply path. Accordingly, in accordance with this plasma processing apparatus 10, the non-uniformity of the processing of the wafer W can be reduced.

As described above, a part of the gas supply unit 18, specifically, the gas line L11, the gas line L21, the gas line L31, the gas diffusion space D11, the gas diffusion space D21 and the gas diffusion space D31, can be formed as the complex formed of the first member 20 and the second member 22 connected as one unit by diffusion bonding. By using the complex formed of the first and the second member 20 and 22, i.e., the upper member, the thickness of the components forming a part of the gas supply unit 18 can be reduced. As a result, in the plasma processing apparatus 10, the thickness of the shower head SH can be reduced. Accordingly, in the plasma processing apparatus 10, a magnetic field generated by an electromagnet can be effectively introduced into the processing space PS in order to control plasma density distribution in the processing space PS. Hereinafter, the structure of the electromagnet will be described in detail.

As shown in FIG. 1, an electromagnet 30 is mounted on the shower head SH. The electromagnet 30 includes a core member 32 and coils 34 and 35. The core member 32 has a structure in which a base 40 and a plurality of cylindrical portions 41 to 43 are formed as one unit, and is made of a magnetic material. The base 40 has a substantially annular plate shape and the central axis thereof coincides with the axis AX. The cylindrical portions 41 to 43 extend downward from the bottom surface of the base 40. Each of the cylindrical portions 41 to 43 has a cylindrical shape and the central axis thereof coincides with the axis AX. The cylindrical portion 42 is provided at the outer side of the cylindrical portion 41, and the cylindrical portion 43 is provided at the outer side of the cylindrical portion 42. The lower ends of the cylindrical portions 41 to 43 are positioned above the outer side of the edge of the wafer W.

A groove is formed between the cylindrical portion 41 and the cylindrical portion 42. A coil 34 wound around the outer peripheral surface of the cylindrical portion 41 is accommodated in the groove. A groove is also formed between the cylindrical portion 42 and the cylindrical portion 43. A coil 35 wound around the outer peripheral surface of the cylindrical portion 42 is accommodated in the groove. A current source is connected to both ends of the coils 34 and 35. When a current is applied from the current source to the coil 34 and/or the coil 35, a magnetic field having horizontal magnetic components disposed in a radial direction about axis AX is generated below the electromagnet 30 in the processing space PS.

Generally, in the parallel plate type plasma processing apparatus, the plasma density distribution in which a plasma density is high near the axis AX and decreased as a distance from the axis AX is increased occurs. The magnetic field generated by the electromagnet 30 can make this plasma density distribution uniform. In other words, when the magnetic field having the horizontal magnetic component is generated by the electromagnet 30, the Lorentz force caused by the horizontal magnetic components is applied to electrons. As a consequence, the electrons move in a drift motion in the circumferential direction about the axis AX. Since the lower ends of the cylindrical portions 41 to 43 are provided above the outer side of the edge of the wafer W as described above, the magnetic field including the horizontal magnetic components is generated above the outer side of the edge of the wafer W. Therefore, the electrons move in a drift motion in the circumferential direction above the outer side of the edge of the wafer W. Due to the drifting electrons, the dissociation of the processing gas at the location above the outer side of the edge of the wafer W is facilitated. As a result, the plasma density above the outer side of the edge of the wafer W is improved. In other words, the electromagnet 30 makes the plasma density distribution uniform in a radial direction about the axis AX. The electromagnet 30 is mounted on the shower head SH that is formed such that the thickness thereof becomes thinner, so that the magnetic field generated by the electromagnet 30 can be effectively introduced into the processing space PS.

Referring back to FIG. 1, the plasma processing apparatus 10 may further include a control unit Cnt. The control unit Cnt may be a programmable computer device, and can control a high frequency power level of the high frequency power supply HFS, a high frequency bias power level of the high frequency power supply LFS, a gas exhaust amount of the gas exhaust unit VS, flow rates of processing gases of the gas sources GS1 to GS3, and a current amount applied to the coil of the electromagnet 30. Therefore, the control unit Cnt can send control signals to the high frequency power supply HFS, the high frequency power supply LFS, the gas exhaust unit VS, the valves and the flow rate controllers connected to the gas sources GS1 to GS3, and the current source connected to the coil of the electromagnet 30 based on a recipe stored in a memory or input by an input unit.

Figure 9:
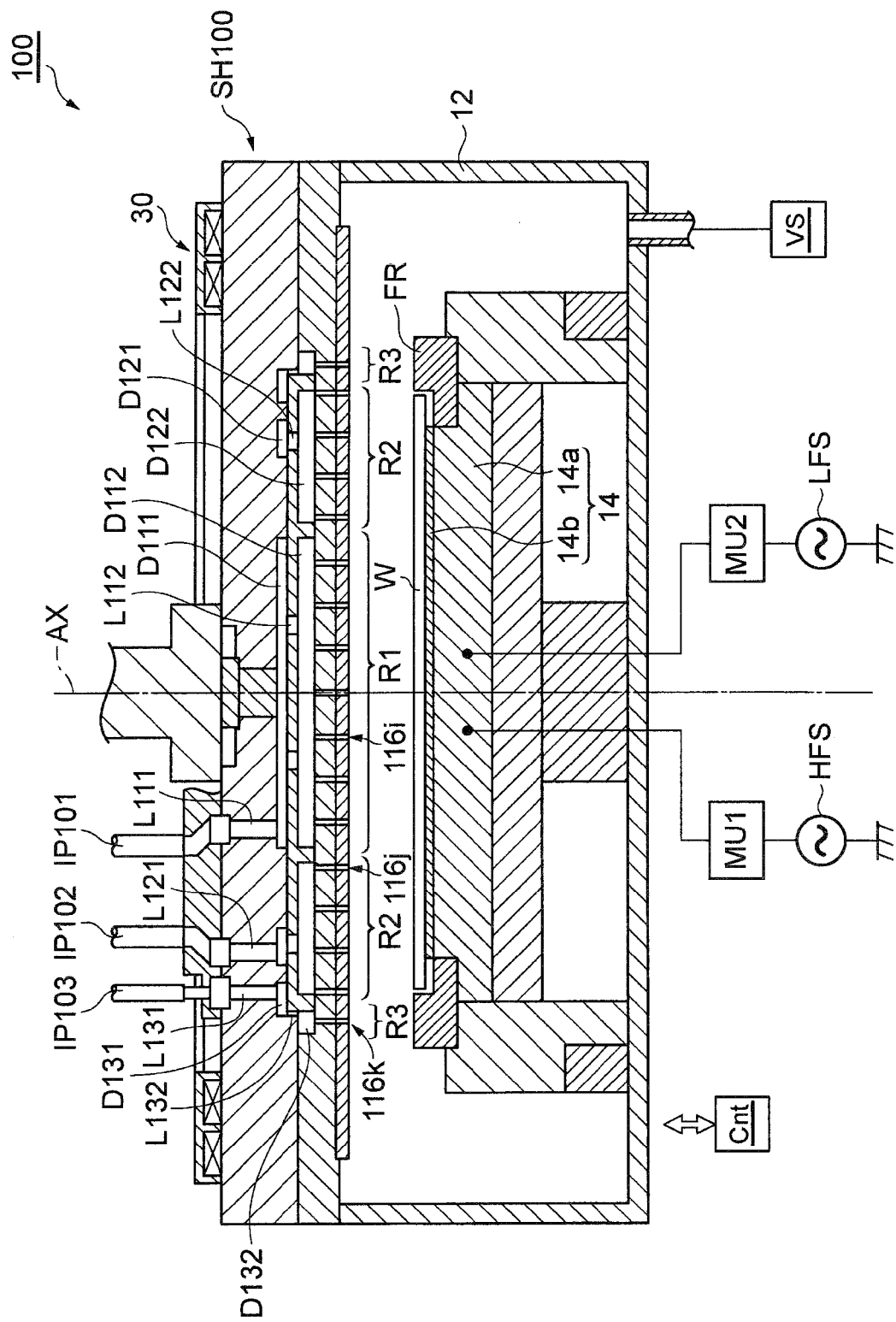
FIG. 9 is a cross sectional view schematically showing a plasma processing apparatus in a reference example.

Hereinafter, an example of calculation of numerical values related to each of the gas supply paths of the shower head SH will be described. Also, an example of calculation of numerical values related to each of the gas supply paths of the shower head SH100 of the plasma processing apparatus 100 in a comparative example shown in FIG. 9 will be described. FIG. 9 is a cross sectional view schematically showing the plasma processing apparatus in the comparative example.

The plasma processing apparatus 100 shown in FIG. 9 is different from the plasma processing apparatus 10 in that a shower head SH100 is provided instead of the shower head SH. The shower head SH100 is different from the shower head SH in that only two gas diffusion spaces are provided in each of a first to a third gas supply path for supplying gases to the first to the third region R1 to R3.

Specifically, the first gas supply of the shower head SH100 has a gas line L111, a gas diffusion space D111, a plurality of gas lines L112 and a gas diffusion space D112. The gas line L111 is spaced apart from the axis AX and extends in parallel to the axis AX. One end of the gas line L111 is connected to a gas inlet line IP101 extending while being spaced apart from the axis AX. The other end of the gas line L111 is connected to the gas diffusion space D111. The gas diffusion space D111 is a substantially disc shaped space disposed along the axis AX. One ends of the gas lines L112 are connected to the gas diffusion space D111. The gas lines L112 extend in parallel to the axis AX and are arranged in the circumferential direction about the axis AX. The other ends of the gas lines L112 are connected to the gas diffusion space D112. The gas diffusion space D112 is a substantially disc shaped space disposed along the axis AX. The gas diffusion space D112 is provided immediately above the first region R1 and connected to a plurality of gas injection holes 116$i$.

The second gas supply of the shower head SH100 has a gas line L121, a gas diffusion space D121, a plurality of gas lines L122 and a gas diffusion space D122. The gas line L121 is further spaced apart from the axis AX in comparison to the gas line L111 and extends in parallel to the axis AX. One end of the gas line L121 is connected to a gas inlet line IP102 extending while being spaced apart from the axis AX. The other end of the gas line L121 is connected to the gas diffusion space D121. The gas diffusion space D121 is a substantially annular plate-shaped space and the central axis thereof coincides with the axis AX. One ends of the gas lines L122 are connected to the gas diffusion space D121. The gas lines L122 extend in parallel to the axis AX and are distributed in the circumferential direction about the axis AX. The other ends of the gas lines L122 are connected to the gas diffusion space D122. The gas diffusion space D122 is a substantially annular plate-shaped space and the central axis thereof coincides with the axis AX. The gas diffusion space D122 is provided immediately above the second region R2 and is connected to a plurality of gas injection holes 116$j$.

The third gas supply of the shower head SH100 has a gas line L131, a gas diffusion space D131, a plurality of gas lines L132 and a gas diffusion space D132. The gas line L131 is further spaced apart from the axis AX in comparison to the gas line L121 and extends in parallel to the axis AX. One end of the gas line L131 is connected to a gas inlet line IP103 extending while being spaced apart from the axis AX. The other end of the gas line L131 is connected to the gas diffusion space D131. The gas diffusion space D131 is a substantially annular plate-shaped space and the central axis thereof coincides with the axis AX. One ends of the gas lines L132 are connected to the gas diffusion space D131. The gas lines L132 extends in parallel to the axis AX and are distributed in the circumferential direction about the axis AX. The other ends of the gas lines L132 are connected to the gas diffusion space D132. The gas diffusion space D132 is a substantially annular plate-shaped space and the central axis thereof coincides with the axis AX. The gas diffusion space D132 is provided immediately above the third region R3 and is connected to a plurality of gas injection holes 116$k$.

Hereinafter, an example of calculation of numerical values of a combined conductance will be described. The flow rate of the gas from the gas injection holes is determined by multiplying a difference between a pressure at an input end of a corresponding gas supply path and a pressure at the opening ends of the gas injection holes by a combined conductance from the input end to the gas injection holes. Therefore, the difference in the flow rates of the gas from the gas injection holes connected to the same gas diffusion space can be expressed by the difference in the combined conductance from the input end to the gas injection holes. Thus, the difference in the gas flow rates indicates a difference between a maximum value and a maximum value of the combined conductance from the input end of the gas supply path to the gas injection holes in each of the regions R1 to R3 of the shower head SH and the shower head SH100.

Figure 10A:
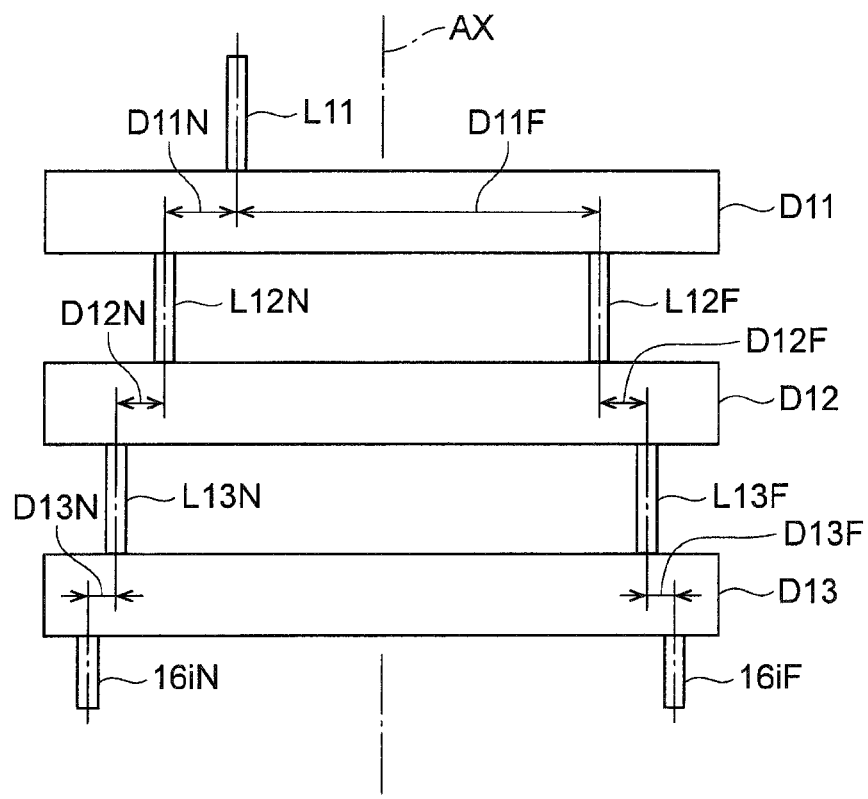
FIGS. 10A and 10B schematically show a first gas supply path.
Figure 10B:
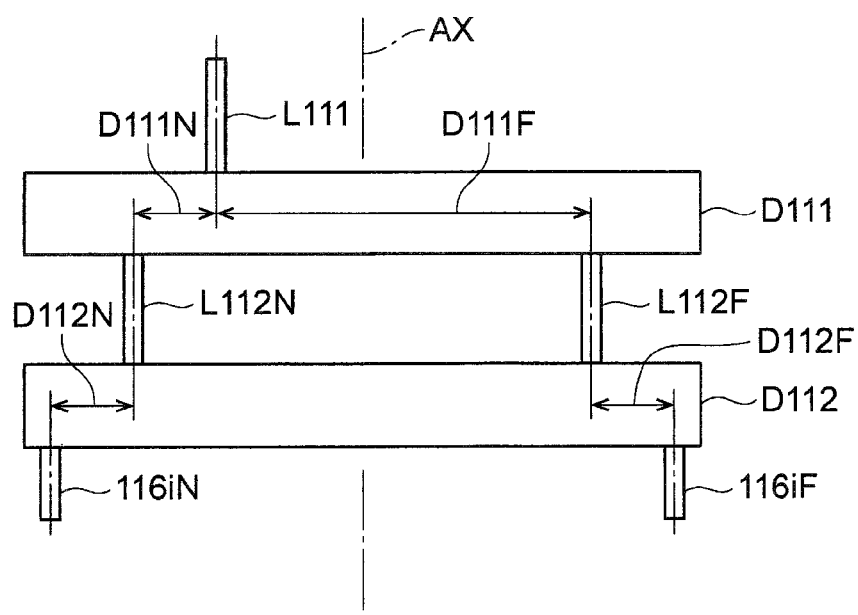

First, a method for calculating a difference between a maximum value and a minimum value of a combined conductance from the input end of the first gas supply path to each of the gas injection holes corresponding thereto will be described with reference to FIG. 10. FIG. 10 schematically shows the first gas supply path. FIG. 10A shows the first gas supply path of the shower head SH and FIG. 10B shows the first gas supply path of the shower head SH100.

As shown in FIG. 10A, in the shower head SH, there were calculated a combined conductance CC3max at the connecting portion between the gas diffusion space D11 and the gas line L11 in a direction intersecting the axis AX among the gas injection holes 16$i$ of the first region R1, i.e., between the input end and a gas injection hole 16$i$F having a shortest distance from the input end, and a combined conductance CC3min between the input end and a gas injection hole 16$i$F having a longest distance from the input end in a direction intersecting the axis AX among the gas injection holes 16$i$ in the first region R1.

Specifically, in order to obtain the combined conductance CC3max, there was calculated a combined conductance of a path including a section D11N of the gas diffusion space D11 between the gas lines L11 and L12N, a section D12N of the gas diffusion space D12 between the gas lines L12N and L13N, gas line L13N, a section D13N of the gas diffusion space D13 between the gas line L13N and the gas injection hole 16$i$ N, and the gas injection hole 16$i$ N. Here, the gas line L12N is a gas line having a shortest distance from the gas line L11 in a direction intersecting the axis AX among the gas lines L12. Further, the gas line L13N is a gas line having a shortest distance from the gas line L11 in a direction intersecting the axis AX among the gas lines L13.

Further, in order to obtain the combined conductance CC3min, there was calculated a combined conductance of a path including a section D11F of the gas diffusion space D11 between the gas lines L11 and L12F, the gas line L12F, a section D12F of the gas diffusion space D12 between the gas lines L12F and L13F, the gas line L13F, a section D13F of the gas diffusion space D13 between the gas line L13F and the gas injection hole 16iF, and the gas injection hole 16iF. Here, the gas line L12F is a gas line having a longest distance from the gas line L11 in a direction intersecting the axis AX among the gas lines L12. Further, the gas line L13F is a gas line having a longest distance from the gas line L11 in a direction intersecting the axis AX among the gas lines L13.

As shown in FIG. 10B, in the shower head SH100, there were calculated a combined conductance CC2max between the input end and a gas injection hole 116iN having a shortest distance from the input end, i.e., the connecting position of the gas line L111 to the gas diffusion space D111 in a direction intersecting the axis AX among the gas injection holes 116i in the first region R1, and a combined conductance CC2min between the input end and a gas injection hole 116iF having a longest distance from the input end in a direction intersecting the axis AX among the gas injection holes 116i in the first region R1.

In order to obtain the combined conductance CC2max, there was calculated a combined conductance of a path including a section D111N of the gas diffusion space D111 between the gas lines L111 and L112N, the gas line L112N, a section D112N of the gas diffusion space D112 between the gas line L112N and gas injection hole 116iN, and the gas injection hole 16i N. Here, the gas line L112N is a gas line having a shortest distance from the gas line L111 in a direction intersecting the axis AX among the gas lines L112.

Moreover, in order to calculate the combined conductance CC2min, there was calculated a combined conductance of a path including a section D111F of the gas diffusion space D111 between the gas lines L111 and L112F, the gas line L112F, a section D112F of the gas diffusion space D112 between the gas line L112F and the gas injection hole 116iF, and the gas injection holes 16iF. Here, the gas line L112F is a gas line having a longest distance from the gas line L111 in a direction intersecting the axis AX among the gas lines L112.

Figure 11A:
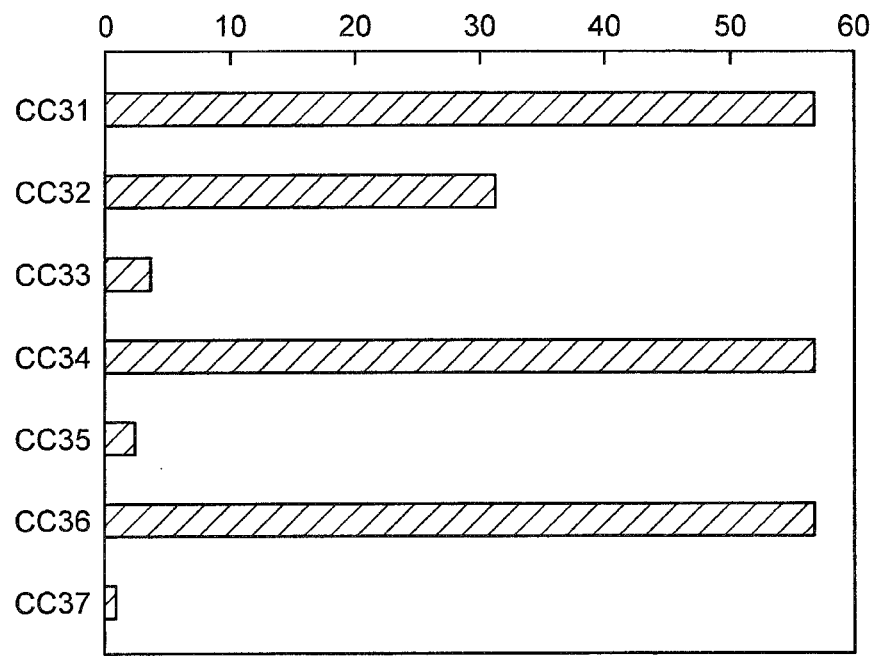
FIGS. 11A and 11B show a conductance of the first gas supply path.
Figure 11B:
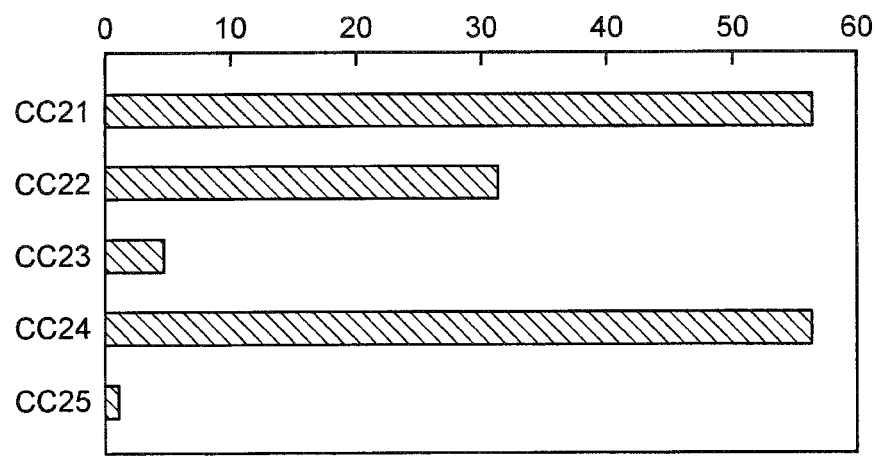

FIG. 11A shows a conductance CC31 of the section D11N, a conductance CC32 of the section D11F, a conductance CC33 of the gas lines L12N and L12F, a conductance CC34 of the sections D12N and D12F, a conductance CC35 of the gas lines L13N and L13F, a conductance CC36 of the sections D13N and D13F, a conductance CC37 of the gas injection holes 16i N and 16iF. FIG. 11B shows a conductance CC21 of the section D111N, a conductance CC22 of the section D111F, a conductance CC23 of the gas lines L112N and L112F, a conductance CC24 of the sections D112N and D112F, and a conductance CC25 of the gas injection holes 116iN and 116iF.

By calculating the difference between the combined conductance CC3max and the combined conductance CC3min obtained by using the conductance shown in FIG. 11A, a difference between a maximum value and a minimum value of the combined conductance from the input end of the first gas supply path of the shower head SH to each of the gas injection holes 16i corresponding thereto was examined. Further, by calculating the difference between the combined conductance CC2max and the combined conductance CC2min obtained by using the conductance shown in FIG. 11B, a difference between a maximum value and a minimum value of the combined conductance from the input end of the first gas supply path of the shower head SH100 to each of the gas injection holes 116i corresponding thereto was examined.

Figure 12:
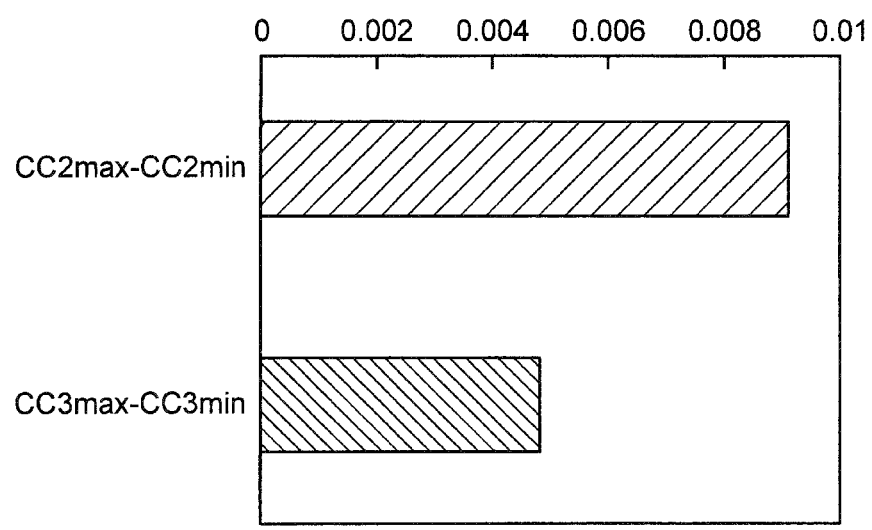
FIG. 12 shows a conductance difference in the first gas supply path.

FIG. 12 shows the difference between CC3max and CC3min and the difference between CC2max and CC2min. As clearly can be seen from FIG. 12, the difference between CC3max and CC3min is considerably smaller than the difference between CC2max and CC2min. Accordingly, it was found that the shower head SH can reduce the difference in the flow rates of the gas injected from the gas injection holes 16i in the first region R1.

Figure 13A:
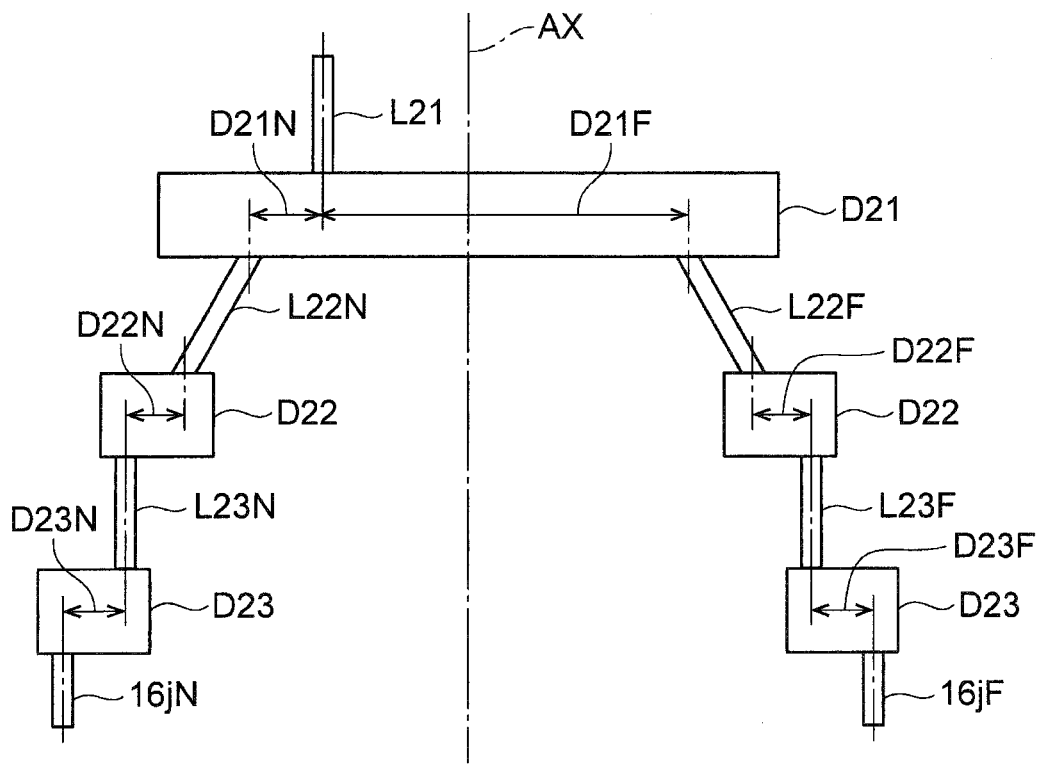
FIGS. 13A and 13B schematically show a second gas supply path.
Figure 13B:
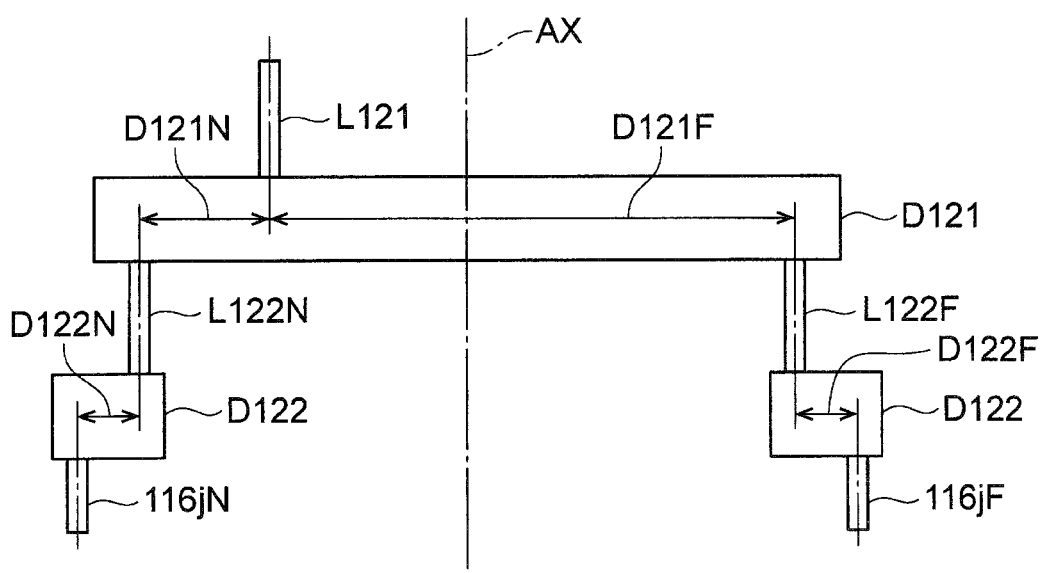

Next, a method for calculating a maximum value and a minimum value of a combined conductance from the second gas supply path to each of the gas injection holes corresponding thereto will be described with reference to FIGS. 13A and 13B. FIGS. 13A and 13B schematically show the second gas supply path. FIG. 13A shows the second gas supply path of the shower head SH, and FIG. 13B shows the second gas supply path of the shower head SH100.

As shown in FIG. 13A, in the shower head SH, there were calculated a combined conductance CE3max between the input end and a gas injection hole 16jN having a shortest distance from the input end, i.e., the connecting position of the gas line L21 to the gas diffusion space D21 in a direction intersecting the axis AX among the gas injection holes 16j in the second region R2, and a combined conductance CE3min between the input end and a gas injection hole 16jF having a longest distance from the input end in a direction intersecting the axis AX among the gas injection holes 16j in the second region R2.

Specifically, in order to calculate the combined conductance CE3max, there was calculated a combined conductance of a path including a section D21N of the gas diffusion space D21 between the gas lines L21 and L22N, the gas line L22N, a section D22N of the gas diffusion space D22 between the gas lines L22N and L23N, the gas line L23N, a section D23N of the gas diffusion space D23 between the gas line L23N and the gas injection hole 16jN, and the gas injection hole 16jN. Here, the gas line L22N is a gas line having a shortest distance from the gas line L21 in a direction intersecting the axis AX among the gas lines L22. Further, the gas line L23N is a gas line having a shortest distance from the gas line L21 in a direction intersecting the axis AX among the gas lines L23.

Moreover, in order to calculate the combined conductance CE3min, there was calculated a combined conductance of a path including a section D21F of the gas diffusion space D21 between the gas lines L21 and L22F, the gas line L22F, a section D22F of the gas diffusion space D22 between the gas lines L22F and L23F, the gas line L23F, a section D23F of the gas diffusion space D23 between the gas lines L23F and the gas injection hole 16jF, and the gas injection hole 16jF. Here, the gas line L22F is a gas line having a longest distance from the gas line L21 in a direction intersecting the axis AX among the gas lines L22. Further, the gas line L23F is a gas line having a longest distance from the gas line L21 in a direction intersecting the axis AX among the gas lines L23.

As shown in FIG. 13B, in the shower head SH100, there were calculated a combined conductance CE2max between the input end and a gas injection hole 116jN having a shortest distance from the input end, i.e., the connecting position of the gas line L121 to the gas diffusion space D121 in a direction intersecting the axis AX among the gas injection holes 116j in the second region R2, and a combined conductance CE2min between the input end and a gas injection hole 116jF having a longest distance from the input end in a direction intersecting the axis AX among the gas injection holes 116j in the second region R2.

In order to calculate the combined conductance CE2max, there was calculated a combined conductance of a path including a section D121N of the gas diffusion space D121 between the gas lines L121 and L122N, the gas line L122N, a section D122N of the gas diffusion space D122 between the gas lines L122N and the gas injection hole 116jN, and the gas injection hole 116jN. Here, the gas line L122N is a gas line having a shortest distance from the gas line L121 in a direction intersecting the axis AX among the gas lines L122.

Further, in order to calculate the combined conductance CE2min, there was calculated a combined conductance of a path including a section D121F of the gas diffusion space D121 between the gas lines L121 and L122F, the gas line L122F, a section D122F of the gas diffusion space D122 between the gas lines L122F and the gas injection hole 116jF, and the gas injection hole 116jF. Here, the gas line L122F is a gas line having a longest distance from the gas line L121 in a direction intersecting the axis AX among the gas lines L122.

Figure 14A:
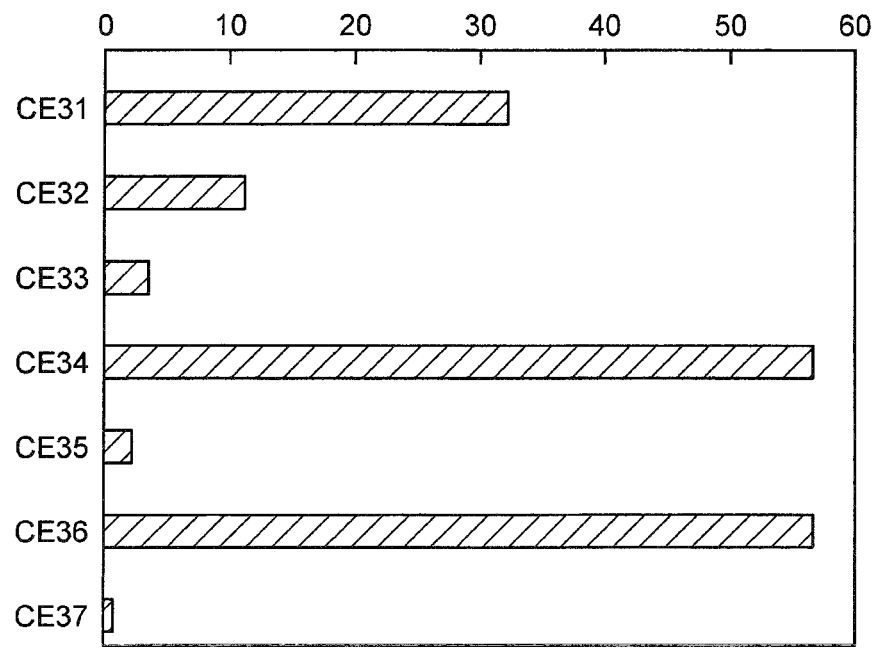
FIGS. 14A and 14B show a conductance of the second gas supply path.
Figure 14B:
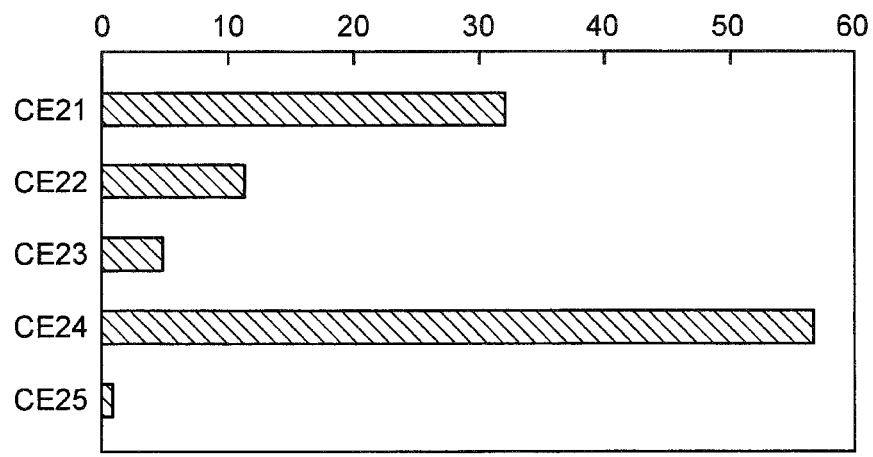

FIG. 14A shows a conductance CE31 of the section D21N, a conductance CE32 of the section D21F, a conductance CE33 of the gas lines L22N and L22F, a conductance CC34 of the sections D22N and D22F, a conductance CE35 of the gas lines L23N and L23F, a conductance CE36 of the sections D23N and D23F, a conductance CE37 of the gas injection holes 16jN and 16jF. FIG. 14B shows a conductance CE21 of the section D121N, a conductance CE22 of the section D121F, a conductance CE23 of the gas lines L122N and L122F, a conductance CE24 of the sections D122N and D122F, and a conductance CE25 of the gas injection holes 116jN and 116jF.

By calculating the difference between the combined conductance CE3max and the combined conductance CE3min obtained by using the conductance shown in FIG. 14A, a difference between a maximum value and a minimum value of the combined conductance from the input end of the second gas supply path of the shower head SH to each of the gas injection holes 16j corresponding thereto was examined. Further, by calculating the difference between the combined conductance CE2max and the combined conductance CE2min obtained by using the conductance shown in FIG. 14B, a difference between a maximum value and a minimum value of the combined conductance from the input end of the second gas supply path of the shower head SH100 to each of the gas injection holes 116j corresponding thereto was examined.

Figure 15:
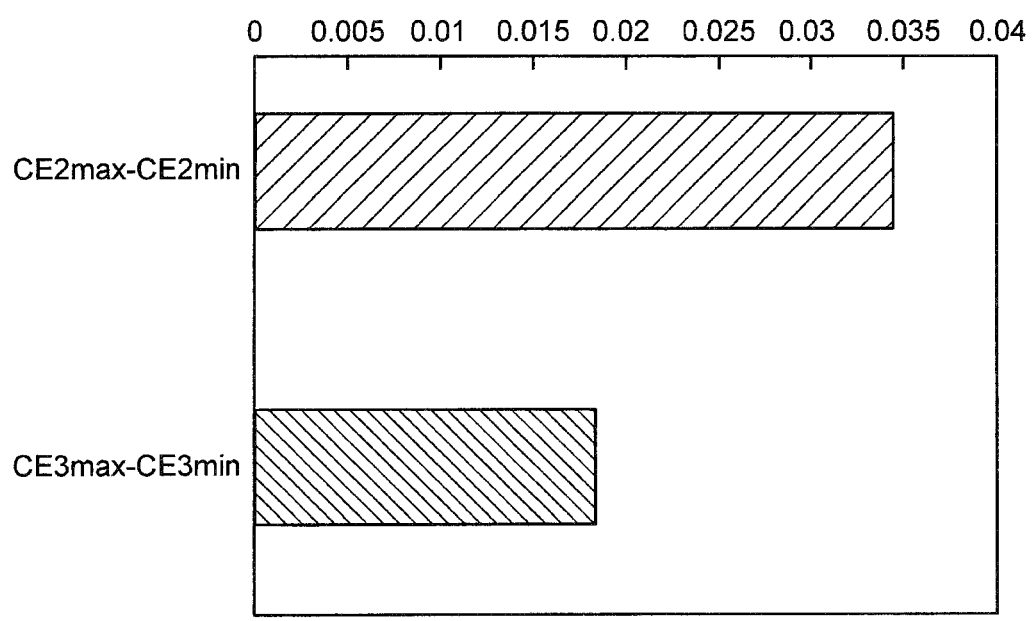
FIG. 15 shows a conductance difference in the second gas supply path.

FIG. 15 shows the difference between CE3max and CE3min and the difference between CE2max and CE2min. As clearly can be seen from FIG. 15, the difference between CE3max and CE3min is considerably smaller than the difference between CE2max and CE2min. Accordingly, it was found that the shower head SH can reduce the difference in the flow rates of the gas injected from the gas injection holes 16j in the second region R2.

Figure 16A:
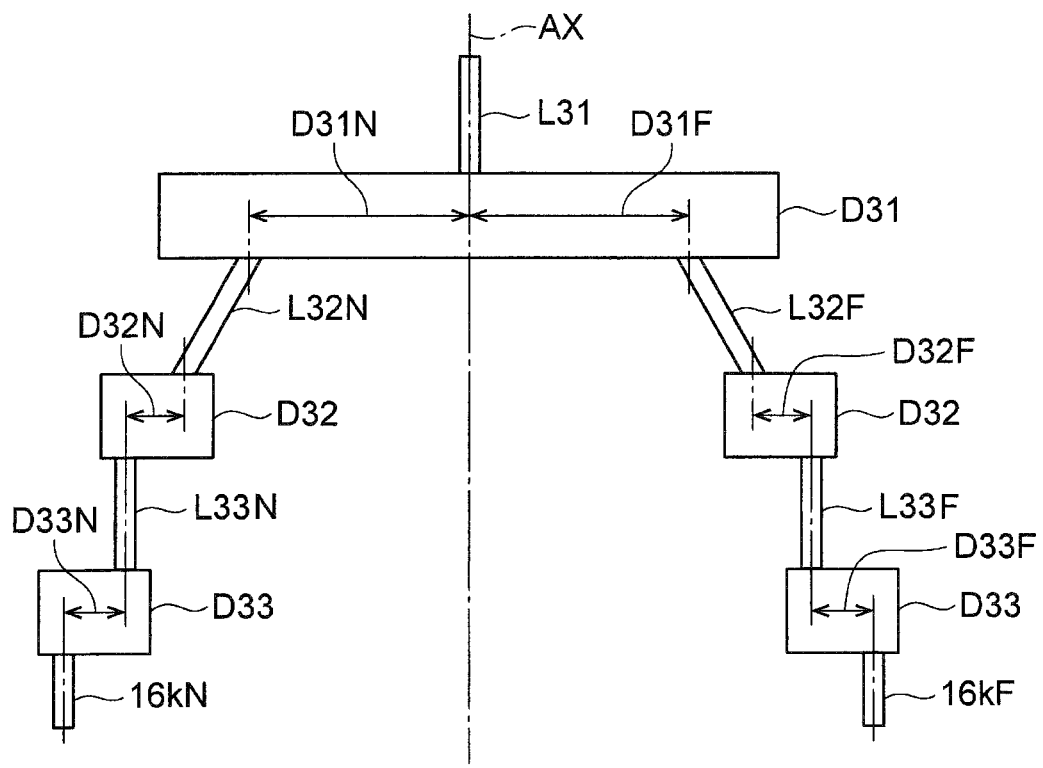
FIGS. 16A and 16B schematically show a third gas supply path.
Figure 16B:
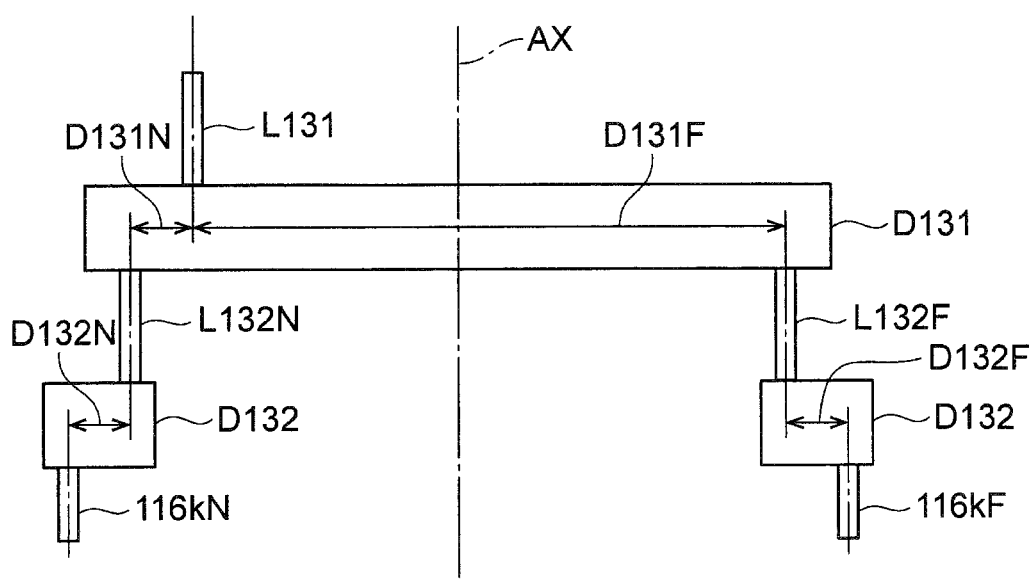

Next, a method for calculating a maximum value and a minimum value of a combined conductance from the third gas supply path to each of the gas injection holes corresponding thereto will be described with reference to FIGS. 16A and 16B. FIGS. 16A and 16B schematically show the third gas supply path. FIG. 16A shows the third gas supply path of the shower head SH, and FIG. 16B shows the third gas supply path of the shower head SH100.

As shown in FIG. 16A, in the shower head SH, the first flow path FL1 of the gas line L31 extends along the axis AX, so that the combined conductance between the connecting position of the gas line L31 to the gas diffusion space D31, i.e., the input end, and one of two gas injection holes 16kN and 16kF of the third region R3 symmetrical with respect to the axis AX among the gas injection holes 16k of the third region R3 and the combined conductance between the input end and the other one of the two gas injection holes 16kN and 16kF were calculated as CV3max and CV3min, respectively.

Specifically, in order to obtain the combined conductance CV3max, there was calculated a combined conductance of a path including a section D31N of the gas diffusion space D31 between the gas lines L31 and L22N, the gas line L32N, a section D32N of the gas diffusion space D32 between the gas lines L32N and L33N, the gas line L33N, a section D33N of the gas diffusion space D33 between the gas lines L33N and the gas injection hole 16kN, and the gas injection hole 16kN. Here, the gas line L32N is a gas line having a shortest distance from the gas injection hole 16kN in a direction intersecting the axis AX among the gas lines L32. Further, the gas line L33N is a gas line having a shortest distance from the gas injection hole 16kN in a direction intersecting the axis AX among the gas lines L33.

Further, in order to calculate the combined conductance CV3min, there was calculated a combined conductance of a path including a section D31F of the gas diffusion space D31 between the gas lines L31 and L32F, the gas line L32F, a section D32F of the gas diffusion space D32 between the gas lines L32F and L33F, the gas line L33F, a section D33F of the gas diffusion space D33 between the gas lines L33F and the gas injection hole 16kF, and the gas injection hole 16kF. Here, the gas line L32F is a gas line having a longest distance from the gas injection hole 16kF in a direction intersecting the axis AX among the gas lines L32. Further, the gas line L33N is a gas line having a longest distance from the gas injection hole 16kF in a direction intersecting the axis AX among the gas lines L33.

As shown in FIG. 16B, in the shower head SH100, there were calculated a combined conductance CV2max between the connecting position of the gas line L131 to the gas diffusion space D131, i.e., the input end, and a gas injection hole 116kN having a shortest distance from the gas line L131 in a direction intersecting the axis AX among the gas injection holes 116k in the third region R3 and a combined conductance CV2min between the input end and a gas injection hole 116kF having a longest distance from the input end in a direction intersecting the axis AX among the gas injection holes 116k in the third region R3.

In order to calculate the combined conductance CV2max, there was calculated a combined conductance of a path including a section D131N of the gas diffusion space D131 between the gas lines L131 and L132N, the gas line L132N, a section D132N of the gas diffusion space D132 between the gas lines L132N and the gas injection hole 116kN, and the gas injection hole 116kN. Here, the gas line L132N is a gas line having a shortest distance from the gas line L131 in a direction intersecting the axis AX among the gas lines L132.

Further, in order to calculate the combined conductance CV2min, there was calculated a combined conductance of a path including a section D131F of the gas diffusion space D131 between the gas lines L131 and L132F, the gas line L132F, a section D132F of the gas diffusion space D132 between the gas lines L132F and the gas injection hole 116kF, and the gas injection hole 116kF. Here, the gas line L132F is a gas line having a longest distance from the gas line L131 in a direction intersecting the axis AX among the gas lines L132.

Figure 17A:
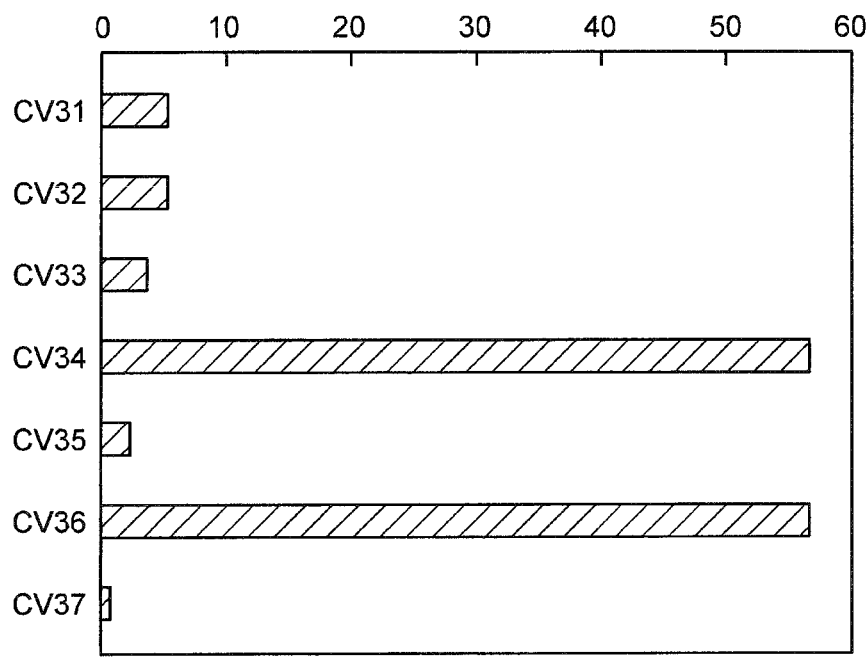
FIGS. 17A and 17B show a conductance of the third gas supply path.
Figure 17B:
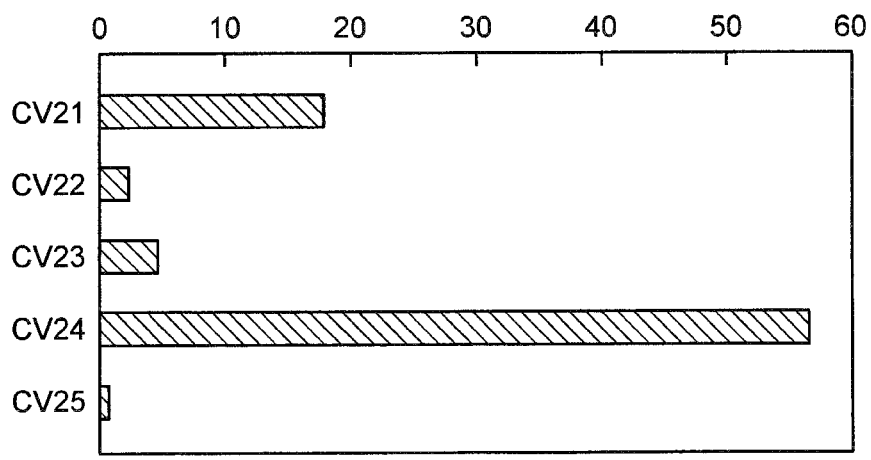

FIG. 17A shows a conductance CV31 of the section D31N, a conductance CV32 of the section D31F, a conductance CV33 of the gas lines L32N and L32F, a conductance CV34 of the sections D32N and D32F, a conductance CV35 of the gas lines L33N and L33F, a conductance CV36 of the sections D33N and D33F, a conductance CV37 of the gas injection holes 16kN and 16kF. FIG. 17B shows a conductance CV21 of the section D131N, a conductance CV22 of the section D131F, a conductance CV23 of the gas lines L132N and L132F, a conductance CV24 of the sections D132N and D132F, and a conductance CV25 of the gas injection holes 116kN and 116kF.

By calculating the difference between the combined conductance CV3max and the combined conductance CV3min obtained by using the conductance shown in FIG. 17A, a difference between a maximum value and a minimum value of the combined conductance from the input end of the third gas supply path of the shower head SH to each of the gas injection holes 16k corresponding thereto was examined. Further, by calculating the difference between the combined conductance CV2max and the combined conductance CV2min obtained by using the conductance shown in FIG. 17B, a difference between a maximum value and a minimum value of the combined conductance from the input end of the third gas supply path of the shower head SH100 to each of the gas injection holes 116k corresponding thereto was examined.

Figure 18:
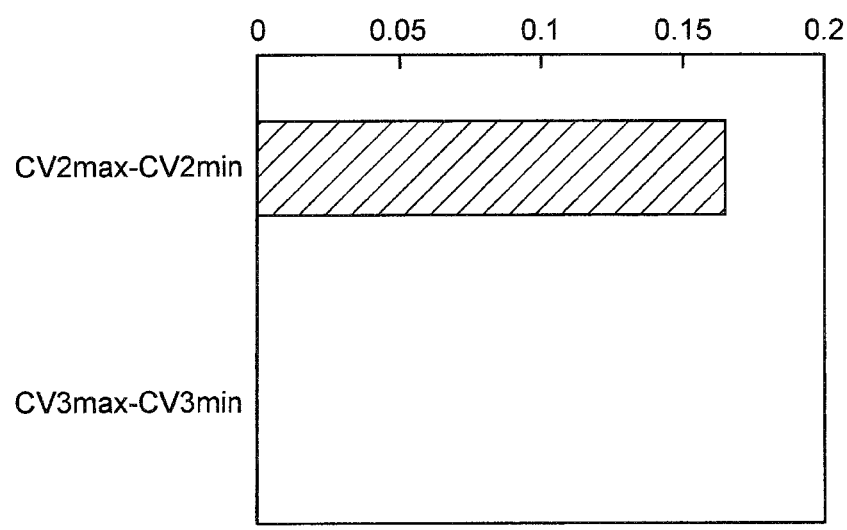
FIG. 18 shows a conductance difference in the third gas supply path.

In this shower head SH, a first gas flow path FL1 of the gas line L31 is provided along the axis AX, and the gas is uniformly distributed to the gas diffusion space D31 in a radial direction by a second flow path FL2. Therefore, the difference in the conductances from the input end of the third gas supply path to each of the gas injection holes 16k is essentially small. Accordingly, as shown in FIG. 18, the difference between the combined conductance CV3max and the combined conductance CV3min is substantially ⌈0⌋. Meanwhile, the difference between the maximum value and the minimum value of the combined conductance from the input end of the third gas supply path of the shower head SH100 to each of the gas injection holes 116k is considerably large as clearly can be seen from the difference between CV2max and CV2min of FIG. 18. Accordingly, the shower head SH can reduce the difference in the flow rates of the gas injected from the gas injection holes 16k in the third region R3.

Next, the volumes of the first to the third gas supply path of the shower head SH were calculated and the volumes of the first to the third gas supply path of the shower head SH100 were calculated. In this calculation, gas diffusion space D11 was set to a space having a diameter of about 95 mm and a height of about 9 mm; the gas line L12 was set to a line having an inner diameter of about 5.5 mm and a length of about 11.7 mm; the gas diffusion space D12 was set to a space having a diameter of about 110 mm and a height of about 6.5 mm; the gas line L13 was set to a line having an inner diameter of about 3 mm and a length of about 3 mm; and the gas diffusion space D13 was set to a space having a diameter of about 156 mm and a height of about 6.5 mm. Further, the gas diffusion space D21 was set to an annular space having an inner diameter of about 110 mm, an outer diameter of about 156 mm, and a height of about 6 mm; the gas line L22 was set to a line having an inner diameter of about 6 mm and a length of about 35.4 mm; the gas diffusion space D22 was set to an annular space having an inner diameter of about 180 mm, an outer diameter of about 220 mm, and a height of about 4.5 mm; the gas line L23 was set to a line having an inner diameter of about 3 mm, and a length of about 3 mm; the gas diffusion space D23 was set to an annular space having an inner diameter of about 171 mm, an outer diameter of about 305 mm and a height of about 6.5 mm. Moreover, the gas diffusion space D31 was set to an annular space having an inner diameter of about 180 mm, an outer diameter of about 215 m, and a height of about 6 mm; the gas line L32 was set to a line having an inner diameter of about 4 mm, and a length of about 35.4 mm; the gas diffusion space D32 was set to an annular space having an inner diameter of about 246 mm, an outer diameter of about 305 mm, and a height of about 4.5 mm; the gas line L33 was set to a line having a cross section of about 0.25 mm$^2$, and a length of about 7.5 mm; and the gas diffusion space D33 was set to an annular space having an inner diameter of about 320 mm, an outer diameter of about 345 mm, and a height of about 13 mm.

Further, in the shower head SH100, the following setting was applied. In other words, the gas diffusion space D111 was set to a space having a diameter of about 158 mm, and a height of about 5 mm; the gas line L112 was set to a line having an inner diameter of about 10 mm and a length of about 6 mm; and the gas diffusion space D112 was set to a space having a diameter of about 156 mm, and a height of about 7.5 mm. Further, the gas diffusion space D121 was set to an annular space having an inner diameter of about 242 mm, an outer diameter of about 274.5 mm, and a height of about 5 mm; the gas line L122 was set to a line having an inner diameter of about 10 mm, and a length of about 6 mm; and the gas diffusion space D122 was set to an inner diameter of about 171 mm, an outer diameter of about 302.5 mm, and a height of about 7.5 mm. Moreover, the gas diffusion space D131 was set to an annular space having an inner diameter of about 289.5 mm, an outer diameter of about 334 mm, and a height of about 5 mm; the gas line L132 is set to a line having an inner diameter of about 8 mm, and a length of about 6 mm; and the gas diffusion space D132 was set to a space having an inner diameter of about 317.5 mm, an outer diameter of about 345 mm, and a height of about 7.5 mm.

Figure 19:
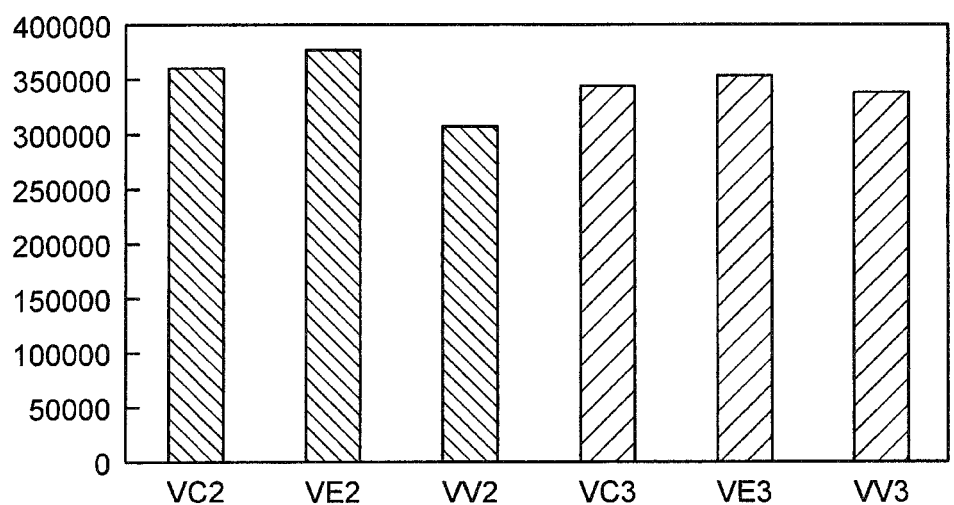
FIG. 19 shows volumes of the first to the third gas supply paths.

FIG. 19 shows volumes VC3, VE3 and VV3 of the first to the third gas supply path of the shower head SH which are calculated under the above setting and volumes VC2, VE2 and VV2 of the first to the third gas supply path of the shower head SH100. As can be clearly seen from the comparison between the volumes VC3, VE3 and VV3 and the volumes VC2, VE2 and VV2 in FIG. 19, in the shower head SH, the volumes of the first to the third gas supply path can become substantially the same. The volume of the gas supply path has a correlation with the time from the input of the gas to the gas supply path to the injection of the gas from the corresponding gas injection hole. Therefore, it was found that when the shower head SH was used, the difference in the time from the input of the gas to the first to the third gas supply path to the injection of the gas from the corresponding gas injection hole could be reduced.

Figure 20:
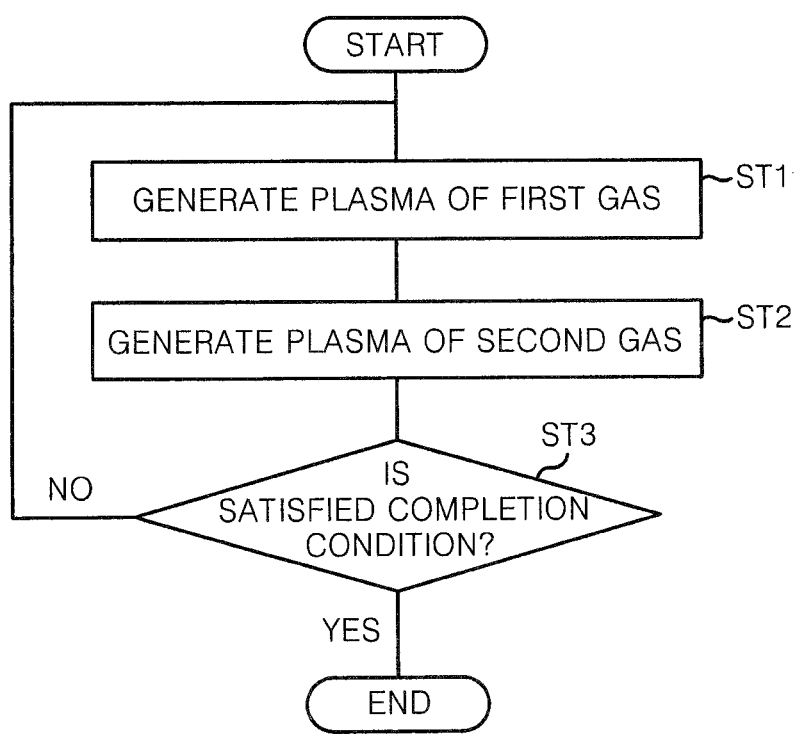
FIG. 20 is a flowchart of a plasma processing method in accordance with an embodiment of the present invention.

Hereinafter, a plasma processing method that can be properly carried out by the plasma processing apparatus 10 having the shower head SH will be described. FIG. 20 is a flowchart of the plasma processing method in accordance with an embodiment of the present invention. As shown in FIG. 20, in this plasma processing method, the steps ST1 and ST2 are repetitively performed in a state where the wafer W is mounted on the mounting table 14.

In the step ST1, a plasma of a first gas is generated in the plasma processing space PS. In the present embodiment, the first gas may be a gas for etching the wafer W. The first gas may be a gas containing a halogen element. For example, when a silicon layer of the wafer W is etched, HBr gas may be used as the first gas. In the step ST1, the gases supplied from the gas injection holes 16i, 16j and 16k of the regions R1, R2 and R3 may be the same or different.

In the step ST2, a plasma of a second gas different from the first gas is generated in the processing space PS. In the present embodiment, the second gas may be a gas for forming a film on the wafer W. In other words, the second gas may be a gas having a deposition property to the surface of the wafer W. Such a gas may be a fluorocarbon-based gas. Further, in the step ST2, the gases supplied from the gas injection holes 16i, 16j and 16k of the regions R1, R2 and R3 may be the same or different.

In the method described in FIG. 20, the steps ST1 and ST2 are repeated until completion conditions are satisfied (step ST3). Whether or not the completion conditions are satisfied may be determined by end point detection or by whether or not a cycle including the steps ST1 and ST2 has been executed in a predetermined number of times.

In the method described in FIG. 20, the first and the second gas are alternately switched. As described above, in accordance with the plasma processing apparatus 10, the difference in the gas injection time between the gas injection holes 16i, 16j and 16k of the regions R1 to R3 of the shower head SH is reduced. Accordingly, the first gas and the second gas injected from the gas injection holes 16i, 16j and 16k are switched substantially at the same timing. Therefore, in accordance with this method, the in-plane non-uniformity of the processing of the wafer W can be reduced.

Hereinafter, a test example that has been performed to examine the plasma processing method described in FIG. 20 will be explained. In this test example, the plasma processing method shown in FIG. 20 was performed on a processing target, e.g., a wafer W in which a photoresist is uniformly formed on a substrate having a diameter of about 300 mm. Specifically, in a step ST1, $SF_6$ gas was supplied from gas sources GS1 to GS3 of the plasma processing apparatus 10 for about 3 seconds. In a step ST2, Ar gas was supplied from gas sources GS1 to GS3 for about 3 seconds, and the cycle of the steps ST1 and ST2 was repeated about 20 times. Further, the flow rate of $SF_6$ gas in the step ST1 was about 700 sccm, and the flow rate of Ar gas in the step ST2 was about 700 sccm. The high frequency power from the high frequency power supply HFS was about 3500 W, and the high frequency bias power from the high frequency power supply LFS was about 0 W.

Further, etching rates at a plurality of points on three arcs having different radiuses about the center of the wafer W were obtained, and the uniformity of the etching rate was calculated. The etching rate was calculated based on the film thickness difference of the photoresist before and after the processing. Further, the uniformity of the etching rate was calculated by an equation of (maximum etching rate−minimum etching rate)/(average of etching rate×2)×100.

Further, in a comparative example, the same processing was performed on the wafer W same as that used in the test example by using the plasma processing apparatus 100 shown in FIG. 9. In the wafer W of the comparative example, etching rates of a plurality of points were obtained on three arcs having different radiuses about the center of the wafer W, and the etching rate uniformity was calculated.

Figure 21:
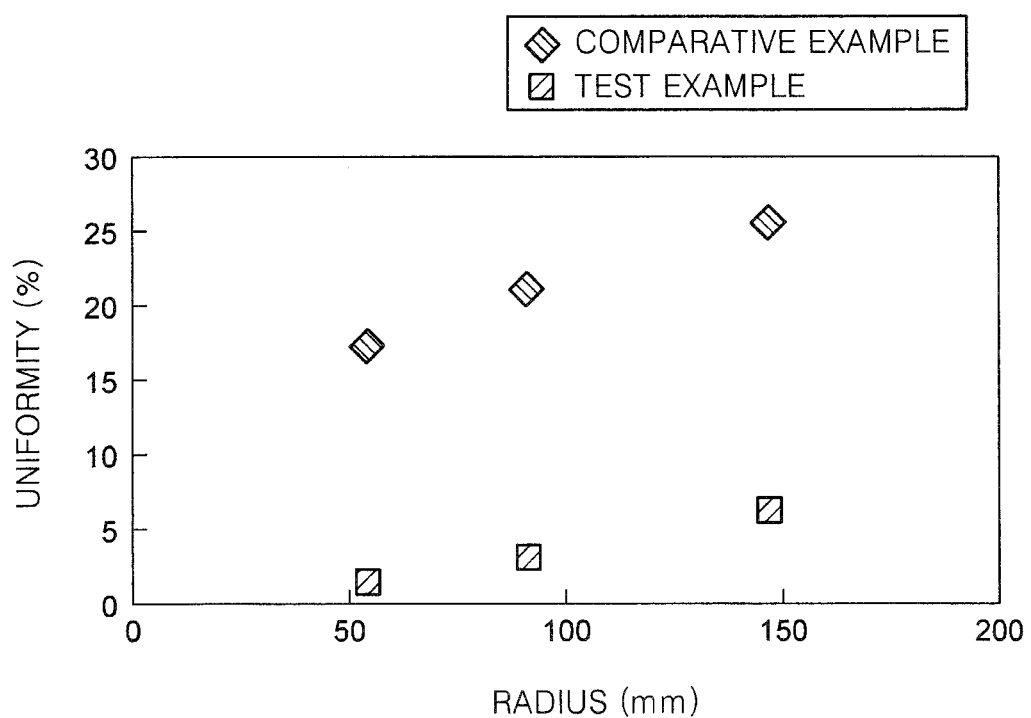
FIG. 21-shows results of a test example and a comparative example 1.

FIG. 21 shows the etching rate uniformity calculated in the test example and the comparative example. A horizontal axis of the graph shown in FIG. 21 indicates a radius of the aforementioned three arcs and a vertical axis indicates the uniformity (%) of the etching rate. As clearly can be seen from FIG. 21, the uniformity of the etching rate in the test example is considerably smaller than the uniformity of the etching rate in the comparative example. Therefore, it was found that the in-plane non-uniformity of the processing of the wafer W could be reduced by the plasma processing method using the plasma processing apparatus 10.

While the invention has been shown and described with respect to the embodiments, it will be understood by those skilled in the art that various changes and modification may be made without departing from the scope of the invention as defined in the following claims.

What is claimed is:

1. A shower head for a plasma processing apparatus, comprising:

a gas injection plate including an upper plate portion and a lower plate portion, the gas injection plate having a first region and a second region coaxially surrounding the first region about an axis, the axis being passing through a center of the gas injection plate in a vertical direction; and a gas supply unit provided on the gas injection plate, the gas supply unit including a first gas supply path and a second gas supply path arranged coaxially about the axis, wherein the first gas supply path is provided in a region along the axis to supply a processing gas to a plurality of first gas injection holes formed in the first region of the gas injection plate;

the second gas supply path is provided in a region surrounding the region where the first gas supply path is provided to supply a processing gas to a plurality of second gas injection holes formed in the second region of the gas injection plate;

the first gas supply path has a first gas line, a first gas diffusion space, a plurality of second gas lines, a second gas diffusion space, a plurality of third gas lines, and a third gas diffusion space which are connected in that order, the third gas diffusion space being connected to the first gas injection holes; and the second gas supply path has a fourth gas line, a fourth gas diffusion space, a plurality of fifth gas lines, a fifth gas diffusion space, a plurality of sixth gas lines, and a sixth gas diffusion space which are connected in that order, the sixth gas diffusion space being connected to the second gas injection holes;

wherein the second gas lines are arranged in a circumferential direction about the axis and have conductances lower than conductances of the first gas diffusion space and the second gas diffusion space;

the third gas lines are arranged in the circumferential direction and have conductances lower than conductances of the second gas diffusion space and the third gas diffusion space;

the fifth gas lines are arranged in the circumferential direction and have conductances lower than conductances of the fourth gas diffusion space and the fifth gas diffusion space; and the sixth gas lines are arranged in the circumferential direction and have conductances lower than conductances of the fifth gas diffusion space and the sixth gas diffusion space, wherein the gas supply unit further includes an upper member formed of a first member having a plurality of through holes and a second member having a plurality of through holes, a recess and a groove, and the first member and the second member is connected as a single unit by diffusion bonding, such that the upper member defines the fourth gas diffusion space, the first gas line, fourth gas line, and a part of the first gas diffusion space;

wherein the gas supply unit further includes an intermediate member defining the remaining part of the first gas diffusion space, the second gas lines, the fifth gas lines, and a part of the second gas diffusion space; and wherein the gas supply unit further includes a lower member defining the remaining part of the second gas diffusion space and the fifth gas diffusion space at a surface side facing the intermediate member and defining the third gas diffusion space and the sixth gas diffusion space at a surface side facing the gas injection plate, wherein the upper member, the intermediate member, and the lower member are laminated such that the first gas diffusion space to the sixth gas diffusion space and the first gas line to the sixth gas line are formed, wherein a position where the first gas line is connected to the first gas diffusion space is spaced apart from the axis and a position where the fourth gas line is connected to the fourth gas diffusion space is spaced apart from the axis, wherein the gas injection plate further includes a third region extending to coaxially surround the second region;

the gas supply unit further includes a third gas supply path arranged coaxially about the axis to supply a processing gas to a plurality of gas injection holes formed in the third region of the gas injection plate, the third gas supply path including a seventh gas diffusion space connected to a seventh gas line of the gas supply unit, a plurality of eighth gas lines, an eighth gas diffusion space, a plurality of ninth gas lines, and a ninth gas diffusion space which are connected in that order;

the eighth gas lines are arranged in the circumferential direction and have conductances lower than the conductances of the seventh gas diffusion space and the eighth gas diffusion space;

the ninth gas lines are arranged in the circumferential direction and have conductances lower than the conductances of the eighth gas diffusion space and the ninth gas diffusion space; and the seventh gas line has a first flow path extending along the axis and a plurality of second flow paths branched from the first flow path, the second flow paths extending in a radial direction about the axis and arranged in the circumferential direction, wherein volumes of the first gas supply path to the third gas supply path are substantially identical to each other.

2. The shower head of claim 1, wherein the intermediate member defines, at a surface side facing the upper member, an extension region which communicates with the first gas diffusion space to extend the first gas diffusion space.

3. The shower head of claim 2, wherein the intermediate member defines, at a surface side facing the lower member, an extension region which communicates with the second gas diffusion space to extend the second gas diffusion space.

4. The shower head of claim 1, wherein the intermediate member defines, at a surface side facing the lower member, an extension region which communicates with the second gas diffusion space to extend the second gas diffusion space.

5. The shower head of claim 1, wherein a distance between the fifth gas diffusion space and the axis is greater than a distance between the fourth gas diffusion space and the axis.

6. A plasma processing apparatus for processing an object by a plasma of a processing gas, the plasma processing apparatus comprising:
the shower head of claim 1.

7. The plasma processing apparatus of claim 6, further comprising:
a processing chamber defining a processing space,
wherein the shower head is provided above the processing space and serves as an upper electrode,
wherein the plasma processing apparatus further comprises:
a mounting table including a mounting region for mounting thereon the object, the mounting table being provided in the processing chamber with a center of the mounting region positioned on the axis, the mounting table serving as a lower electrode;
a first gas inlet line connected to the first gas line;
a second gas inlet line connected to the fourth gas line; and
an electromagnet, for generating a magnetic field including horizontal magnetic components in a radial direction about the axis, provided above the shower head and extending in a circumferential direction to surround the first gas inlet line and the second gas inlet line.

* * * * *